US008854599B2

(12) United States Patent
Hara et al.

(10) Patent No.: US 8,854,599 B2
(45) **Date of Patent: *Oct. 7, 2014**

(54) LIQUID RECOVERY APPARATUS, EXPOSURE APPARATUS, EXPOSURE METHOD, AND DEVICE MANUFACTURING METHOD

(75) Inventors: Hideaki Hara, Kumagaya (JP); Hiroaki Takaiwa, Kumagaya (JP); Dai Arai, Tokyo (JP)

(73) Assignee: Nikon Corporation, Tokyo (JP)

( * ) Notice: Subject to any disclaimer, the term of this patent is extended or adjusted under 35 U.S.C. 154(b) by 55 days.

This patent is subject to a terminal disclaimer.

(21) Appl. No.: 12/923,568

(22) Filed: Sep. 28, 2010

(65) Prior Publication Data

US 2011/0013161 A1 Jan. 20, 2011

Related U.S. Application Data

(60) Division of application No. 11/606,935, filed on Dec. 1, 2006, now Pat. No. 7,826,031, which is a division of application No. 11/171,243, filed on Jul. 1, 2005, now Pat. No. 7,847,916, which is a continuation-in-part of application No. PCT/JP2004/012787, filed on Aug. 27, 2004.

(30) Foreign Application Priority Data

Aug. 29, 2003 (JP) ................................ 2003-307771
May 20, 2004 (JP) ................................ 2004-150353

(51) Int. Cl.
*G03F 7/20* (2006.01)

(52) U.S. Cl.
CPC ........ *G03F 7/70341* (2013.01); *G03F 7/70991* (2013.01)
USPC ........................................................ 355/30

(58) Field of Classification Search
None
See application file for complete search history.

(56) References Cited

U.S. PATENT DOCUMENTS 2,373,642 A 4/1945 Backofen et al.
4,291,575 A * 9/1981 Frissora ......................... 73/302

(Continued)

FOREIGN PATENT DOCUMENTS

DE 221 563 A1 4/1985
EP 0 945 960 A2 9/1999

(Continued)

OTHER PUBLICATIONS

Jul. 21, 2011 Office Action issued in U.S. Appl. No. 12/318,574.

(Continued)

*Primary Examiner* — Peter B Kim
*Assistant Examiner* — Michelle Iacoletti
(74) *Attorney, Agent, or Firm* — Oliff PLC

(57) ABSTRACT

An exposure apparatus exposes a substrate by projecting an image of a pattern onto the substrate via a projection optical system and a liquid that fills a space between the projection optical system and the substrate. The exposure apparatus has a liquid supply system having a supply path that supplies liquid to the space between the projection optical system and the substrate. A liquid recovery system having a recovery path recovers the liquid from the space during the exposure. The apparatus also includes a suction path with which at least part of the supply path of the liquid supply system is connected when the exposure apparatus functions abnormally.

56 Claims, 9 Drawing Sheets

COMMERCIAL POWER SOURCE
100
102
BACK-UP POWER SOURCE
IL
EX
MSTD
MST
M
EL
MASK STAGE DRIVE DEVICE
AX
25
PL
VACUUM SYSTEM
PK
15
10
LIQUID SUPPLY PORTION
11
23
26
20
22
13
17
LIQUID RECOVERY PORTION
28
24
18
16
2a
2
81
61(60)
82
43
61(60)
CONTROLLER
CONT
62
43
21
14
P
45
PST
51
52
46
53
SUBSTRATE STAGE DRIVE DEVICE
Z
Y
X
PST
1
AR1
AR2
PSTD

(56) References Cited

U.S. PATENT DOCUMENTS

| | | | | |
|---|---|---|---|---|
| 5,298,939 | A | 3/1994 | Swanson et al. | |
| 5,528,118 | A | 6/1996 | Lee | |
| 5,586,159 | A * | 12/1996 | Kitaoka et al. | 378/34 |
| 5,610,683 | A | 3/1997 | Takahashi | |
| 5,623,853 | A | 4/1997 | Novak et al. | |
| 5,762,747 | A | 6/1998 | Park et al. | |
| 5,874,820 | A | 2/1999 | Lee | |
| 5,927,605 | A | 7/1999 | Odajima et al. | |
| 6,304,005 | B1 | 10/2001 | Aoki et al. | |
| 7,038,760 | B2 * | 5/2006 | Mulkens et al. | 355/30 |
| 7,411,653 | B2 | 8/2008 | Hoogendam et al. | |
| 7,826,031 | B2 | 11/2010 | Hara et al. | |
| 7,847,916 | B2 | 12/2010 | Hara et al. | |
| 2001/0018153 | A1 | 8/2001 | Irie | |
| 2002/0034399 | A1 * | 3/2002 | Matsumoto et al. | 399/119 |
| 2002/0129838 | A1 | 9/2002 | Myland | |
| 2003/0096405 | A1 * | 5/2003 | Takayama et al. | 435/366 |
| 2004/0207824 | A1 | 10/2004 | Lof et al. | |
| 2004/0263809 | A1 | 12/2004 | Nakano | |
| 2005/0018155 | A1 * | 1/2005 | Cox et al. | 355/30 |
| 2005/0048220 | A1 | 3/2005 | Mertens et al. | |
| 2005/0243293 | A1 | 11/2005 | Hara et al. | |
| 2005/0263068 | A1 | 12/2005 | Hoogendam et al. | |
| 2006/0023183 | A1 | 2/2006 | Novak et al. | |
| 2006/0132737 | A1 | 6/2006 | Magome et al. | |
| 2008/0278696 | A1 | 11/2008 | Hoogendam et al. | |

FOREIGN PATENT DOCUMENTS

| | | |
|---|---|---|
| EP | 1 659 620 A1 | 5/2006 |
| JP | A-01-209371 | 8/1989 |
| JP | A-1-278240 | 11/1989 |
| JP | A-2-97239 | 4/1990 |
| JP | A-05-176461 | 7/1993 |
| JP | A-5-199680 | 8/1993 |
| JP | A-6-124873 | 5/1994 |
| JP | A-8-166475 | 6/1996 |
| JP | A-8-330224 | 12/1996 |
| JP | A-09-021471 | 1/1997 |
| JP | A-9-115794 | 5/1997 |
| JP | A-10-095131 | 4/1998 |
| JP | A-10-163009 | 6/1998 |
| JP | A-10-211948 | 8/1998 |
| JP | A-10-214783 | 8/1998 |
| JP | A-10-281335 | 10/1998 |
| JP | 10303114 A * | 11/1998 |
| JP | A-10-303114 | 11/1998 |
| JP | A-10-340846 | 12/1998 |
| JP | A-2000-505958 | 5/2000 |
| JP | A-2002-15978 | 1/2002 |
| JP | A-2002-141278 | 5/2002 |
| JP | A-2010-103560 | 5/2010 |
| JP | B-4492538 | 6/2010 |
| WO | WO 98/28665 | 7/1998 |
| WO | WO 99/49504 | 9/1999 |
| WO | WO 2005/022615 A1 | 3/2005 |

OTHER PUBLICATIONS

May 28, 2008 Office Action in U.S. Appl. No. 11/171,243.
Feb. 26, 2009 Office Action in U.S. Appl. No. 11/171,243.
Oct. 19, 2009 Notice of Allowance in U.S. Appl. No. 11/171,243.
Mar. 4, 2008 Office Action in U.S. Appl. No. 11/606,935.
Jul. 17, 2009 Office Action in U.S. Appl. No. 11/606,935.
Dec. 7, 2004 International Search Report in International Application No. PCT/JP2004/012787, with translation.
May 22, 2006 International Preliminary Report on Patentability in International Application No. PCT/JP2004/012787, with translation.
Mar. 26, 2007 Australian Written Opinion in Singapore Patent Application No. 200504908-5.
Jan. 27, 2010 Notice of Allowance in U.S. Appl. No. 11/171,243.
Mar. 10, 2010 Notice of Allowance in U.S. Appl. No. 11/606,935.
Nov. 24, 2009 Office Action in Japanese Application No. 2005-513548, with translation.
Mar. 16, 2010 Notice of Allowance in Japanese Application No. 2005-513548, with translation.
Jan. 4, 2008 Supplementary European Search Report in European Application No. 04772736.7.
May 5, 2008 Australian Examination Report in Singapore Application No. 200504908-5.
May 3, 2010 Notice of Allowance in U.S. Appl. No. 11/171,243.
Jun. 24, 2010 Notice of Allowance in U.S. Appl. No. 11/606,935.
Aug. 23, 2010 Notice of Allowance in U.S. Appl. No. 11/171,243.
Mar. 19, 2012 Office Action issued in EP Application No. 04 772 736.7.
Mar. 29, 2012 Office Action issued in KR Application No. 2005-7011493 (with English translation).
Apr. 3, 2012 Office Action issued in JP Application No. 2010-013499 (with English translation).
Apr. 3, 2012 Office Action issued in JP Application No. 2010-013501 (with English translation).
Jun. 8, 2012 Office Action issued in U.S. Appl. No. 12/318,574.
Aug. 7, 2012 Office Action issued in JP Application No. 2010-013499 (with English translation).
Dec. 6, 2012 Advisory Action issued in U.S. Appl. No. 12/318,574.
Aug. 19, 2013 Office Action issued in U.S. Appl. No. 12/318,574.
May 7, 2013 Office Action issued in Japanese Patent Application No. 2011-098569 (with translation).
Dec. 11, 2013 Office Action issued in U.S. Appl. No. 13/751,469.
Dec. 23, 2013 Examination Report issued in Singaporean Application No. 200801487-0.
Oct. 8, 2013 Office Action issued in Japanese Patent Application No. 2012-066146 (with translation).
Oct. 31, 2013 Office Action issued in Taiwanese Patent Application No. 101123703 (with translation).
Feb. 10, 2014 Office Action issued in U.S. Appl. No. 12/318,574.
Jun. 20, 2014 Office Action issued in U.S. Appl. No. 12/318,574.

* cited by examiner

CONTROLLER
CONT
MASK STAGE DRIVE DEVICE
MSTD
LIQUID SUPPLY PORTION
SUBSTRATE STAGE DRIVE DEVICE
PSTD
COMMERCIAL POWER SOURCE
BACK-UP POWER SOURCE
VACUUM SYSTEM
LIQUID RECOVERY PORTION
EX
IL
EL
AX
PL
PK
M
MST
PST
AR1
AR2
Z
X
Y

TO LIQUID RECOVERY PORTION 28
20
25
23'
22'
VACUUM SYSTEM
DRYER
SEPARATOR
DRYER
23
24'
26
SEPARATOR
22
LIQUID RECOVERY PORTION
28
1
24
14C'
21B
AR1
21B'
14C
15
14B'
14A'
14A
14B
21A
21A'
1
18
17
15'
Xa
SCANNING DIRECTION
16
Xb
SCANNING DIRECTION
13
LIQUID SUPPLY PORTION
11
18'
16'
13'
17'
10
Y
X

VACUUM SYSTEM
70
DRYER
72
SEPARATOR
71
LIQUID RECOVERY PORTION
73
68
69
SEPARATOR
75
DRYER
76
VACUUM SYSTEM
74
PL
2
2a
1
43
61
62
45
60
63
64
51
67
65
66
P
X
Y
Z

SWITCHING PORTION 19 SIDE

SUPPLY PORT 14A SIDE

SWITCHING PORTION 19 SIDE

SUPPLY PORT 14A SIDE

SWITCHING PORTION 19 SIDE

SUPPLY PORT 14A SIDE

SWITCHING PORTION 19 SIDE

SUPPLY PORT 14A SIDE

LIQUID RECOVERY APPARATUS, EXPOSURE APPARATUS, EXPOSURE METHOD, AND DEVICE MANUFACTURING METHOD

RELATED APPLICATIONS

This is a Divisional of U.S. patent application Ser. No. 11/606,935 filed Dec. 1, 2006 (now U.S. Pat. No. 7,826,031), which in turn is Divisional of U.S. patent application Ser. No. 11/171,243 filed Jul. 1, 2005 (now U.S. Pat. No. 7,847,916), which is a Continuation-In-Part of International Application No. PCT/JP04/012787 filed Aug. 27, 2004. The entire disclosure of each of said U.S. patent application Ser. No. 11/606,935, U.S. patent application Ser. No. 11/171,243 and of said International Application No. PCT/JP04/012787 is incorporated by reference herein in their entireties. The disclosure of each of the following priority applications is incorporated by reference herein in its entirety: Japanese Patent Application No. 2003-307771 filed Aug. 29, 2003; and Japanese Patent Application No. 2004-150353 filed May 20, 2004.

BACKGROUND

This invention relates to liquid recovery apparatus, exposure apparatus, exposure methods, and device manufacturing methods, and particularly to exposure apparatus that fill a space between a projection optical system and a substrate with liquid and expose a pattern onto a substrate via the projection optical system and the liquid, and device manufacturing methods using the exposure apparatus.

Semiconductor devices and liquid crystal display devices are manufactured by a so-called photolithographic method that transfers a pattern formed on a mask onto a photosensitive substrate. An exposure apparatus that is used in this photolithographic method is provided with a mask stage that supports a mask, and a substrate stage that supports a substrate. The exposure apparatus transfers a mask pattern onto a substrate via a projection optical system while synchronously moving the mask stage and the substrate stage. Recently, higher resolution of the projection optical system is demanded to obtain higher integration of a device pattern. The resolution of the projection optical system increases as an exposure wavelength that is used becomes shorter and a numerical aperture of the projection optical system becomes larger. Because of this, the exposure wavelength that is used in exposure apparatus has become shortened over the years, and the numerical aperture of projection optical systems has increased. Furthermore, although an exposure wavelength of 248 nm of a KrF excimer laser is currently the mainstream, an exposure wavelength of 193 nm of an ArF excimer laser also has been put into practice. When performing exposure, a depth of focus (DOF) also becomes important in addition to the resolution. The resolution R and the depth of focus δ can be expressed by the following equations.

$$R=k_1\cdot\lambda/NA \quad (1)$$

$$\delta=\pm k_2\cdot\lambda/NA^2 \quad (2)$$

Here, $\lambda$ is an exposure wavelength, NA is a numerical aperture of the projection optical system, and $k_1$, $k_2$ are process coefficients. According to equations (1) and (2), in order to increase the resolution R, by shortening the exposure wavelength $\lambda$ and increasing the numerical aperture NA, it is understood that the depth of focus $\delta$ becomes narrower.

When the depth of focus $\delta$ becomes too narrow, it is difficult to match a substrate surface with an image plane of the projection optical system, and there is a possibility that a focus margin may become insufficient at the time of an exposure operation. Therefore, a liquid immersion method has been proposed, as disclosed in, for example, WO99/49504, as a method that substantially shortens an exposure wavelength and broadens the depth of focus. This liquid immersion method fills the space between a lower surface of the projection optical system and a substrate surface with liquid such as water, an organic solvent, or the like, and improves the resolution by taking advantage of the fact that the wavelength of the exposure light in liquid becomes 1/n (n is normally approximately 1.2-1.6 depending on the index of refraction of the liquid) as compared to the wavelength in air, and increases the depth of focus by approximately n-times.

Meanwhile, the exposure apparatus disclosed in the above-mentioned reference has a structure in which a liquid immersion region is formed on a substrate by supplying and recovering liquid using a liquid supply mechanism and a liquid recovery mechanism. However, when the drive of the liquid recovery mechanism stops due to an abnormality of a power source, such as a power outage, etc., the liquid remaining on the substrate leaks or splashes to an outside of the substrate stage. Therefore, the liquid gets on mechanical parts near the substrate stage, and problems occur such as oxidation, failure, etc.

SUMMARY

One object of some embodiments of this invention is to provide a liquid recovery apparatus, and an exposure apparatus, an exposure method, and a method of manufacturing a device using the exposure apparatus, that can suppress liquid from flowing out and/or splashing, even when a power source abnormality occurs due to a power outage, for example.

An exposure apparatus that incorporates one or more aspects of the invention includes a space between a projection optical system and a substrate that is filled with liquid, and exposes the substrate by projecting an image of a pattern onto the substrate via the projection optical system and the liquid.

According to one aspect, the exposure apparatus includes a liquid recovery mechanism having a drive portion that is driven by power supplied from a first power source, and a second power source different from the first power source. When the first power source stops supplying power, a supply of power for the drive portion is switched to the second power source.

According to another aspect, the exposure apparatus includes a liquid supply mechanism that supplies liquid, wherein the liquid supply mechanism includes a discharging mechanism that discharges liquid stored in a liquid supply flow path after power supply is stopped.

According to another aspect, the exposure apparatus includes a liquid supply mechanism having a liquid supply flow path that supplies the liquid, wherein the liquid supply mechanism includes a cut-off portion that cuts off the liquid supply flow path at the time of an abnormality.

According to another aspect, the exposure apparatus includes a liquid supply mechanism that supplies liquid, wherein the liquid supply mechanism includes a sensor that detects liquid that remains in a liquid supply flow path when power supply is stopped.

An exposure apparatus that incorporates one or more aspects of the invention exposes an image of a pattern onto a substrate via a projection optical system and includes a liquid recovery mechanism that recovers liquid supplied to the substrate and that is supplied with power from a first power source. According to one aspect, the exposure apparatus also includes a second power source that supplies power to the liquid recovery mechanism at least when the first power source is abnormal. According to another aspect, the exposure apparatus includes a liquid supply mechanism having a supply path that supplies liquid between the projection optical system and the substrate, wherein a suction portion having a suction path that draws the liquid is disposed in the liquid supply mechanism.

Another aspect of the invention relates to a liquid recovery device having a liquid recovery mechanism that recovers liquid supplied to a substrate and that is supplied with power from a first power source. The liquid recovery device includes a second power source that supplies power to the liquid recovery mechanism at least when the first power source is abnormal.

Another aspect of the invention relates to an exposure method in which liquid is supplied between a projection optical system and a substrate, and a pattern is exposed onto the substrate via the projection optical system and the liquid. According to one aspect, the method includes the steps of: recovering the liquid by a liquid recovery mechanism supplied with power from a first power source; and recovering the liquid by the liquid recovery mechanism supplied with power from a second power source different from the first power source at least when the first power source is abnormal. According to another aspect, the method includes the step of drawing the liquid from the liquid supply mechanism in response to a processing state of an exposure process.

BRIEF DESCRIPTION OF THE DRAWINGS

The invention will be described in conjunction with the following drawings of exemplary embodiments in which like reference numerals designate like elements, and in which.

DETAILED DESCRIPTION OF EXEMPLARY EMBODIMENTS

Figure 1:
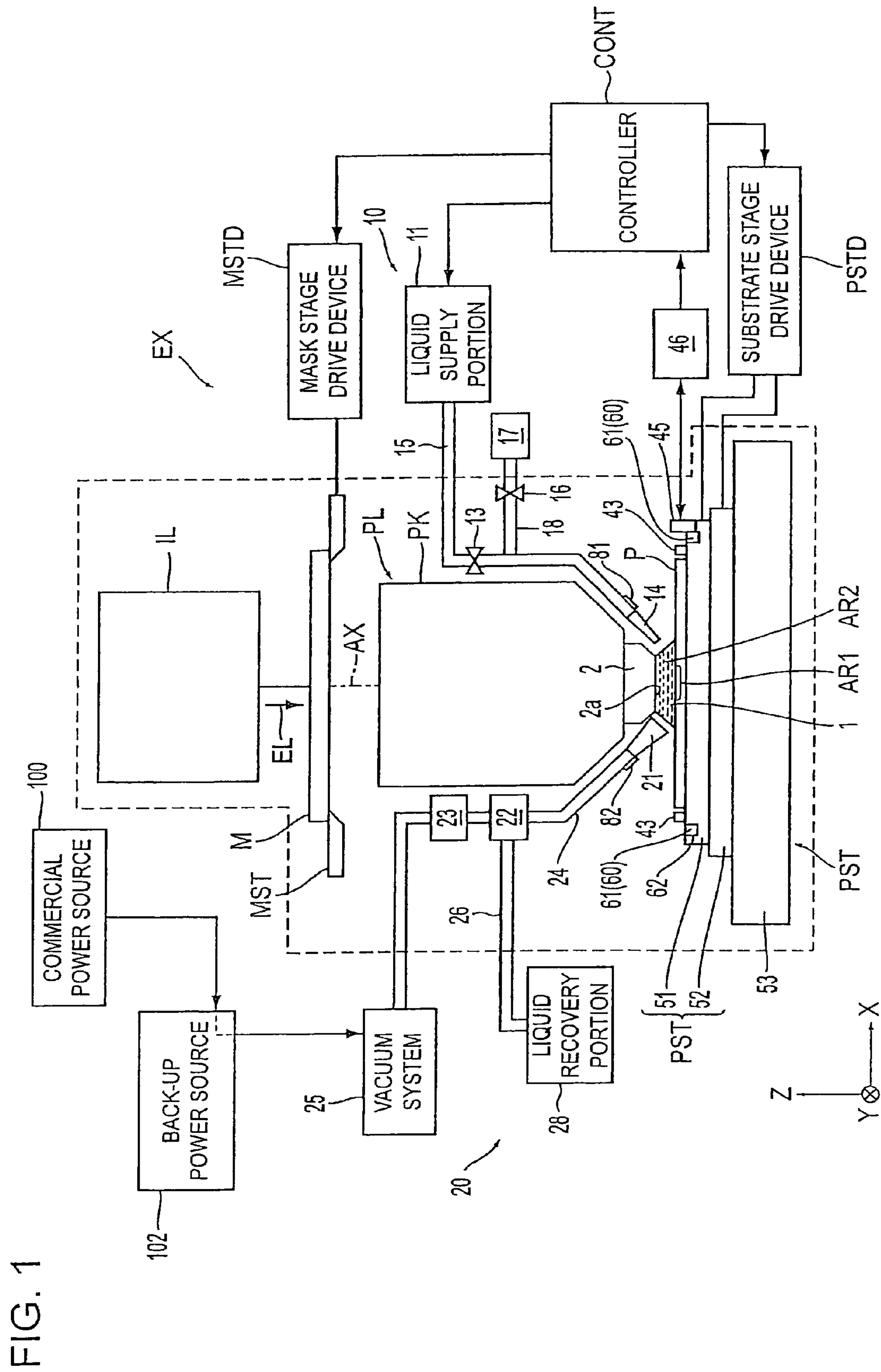
FIG. 1 is a schematic structural view showing an exposure apparatus of one embodiment.

An exposure apparatus according to a first aspect of this invention has a space between a projection optical system and a substrate that is filled with liquid, and exposes the substrate by projecting an image of a pattern onto the substrate via the projection optical system and the liquid. The exposure apparatus includes a liquid recovery mechanism having a drive portion that is driven by power supplied from a first power source, and a second power source different from the first power source. When the first power source stops supplying power, a power supply for the drive portion is switched to the second power source. When the liquid recovery mechanism is driven by the power that is supplied from the first power source, even when there is an abnormality in the first power source, the power supply for the liquid recovery mechanism is switched to the second power source. Accordingly, liquid that remains on the substrate is recovered by the liquid recovery mechanism that is driven by the power that is supplied from the second power source, and thus the liquid is not left on the substrate. Therefore, out-flow of the liquid can be suppressed, and problems that occur due to out-flow of the liquid can be suppressed.

An exposure apparatus according to a second aspect of this invention exposes an image of a pattern image onto a substrate by a projection optical system, and includes a liquid recovery mechanism supplied with power from a first power source and that recovers liquid supplied to the substrate. The apparatus also includes a second power source that supplies power to the liquid recovery mechanism at least when the first power source is abnormal. When there is an abnormality in the first power source, the second power source supplies the power to the liquid recovery mechanism. Thus, even when there is an abnormality in the first power source, the liquid supplied to the substrate can be recovered, and deterioration of mechanical parts and electrical parts in the vicinity of the substrate can be suppressed.

An exposure apparatus according to a third aspect of this invention has a space between a projection optical system and a substrate that is filled with liquid, and exposes the substrate by projecting an image of a pattern onto the substrate via the projection optical system and the liquid. This exposure apparatus includes a liquid supply mechanism that supplies liquid, and the liquid supply mechanism is provided with a discharging mechanism that discharges liquid stored in a liquid supply flow path after power supply is stopped. When the power supply is stopped, the discharging mechanism discharges (removes) liquid stored in the liquid supply flow path. Thus, if the discharged liquid is recovered, a problem in which the liquid leaks onto the substrate from the liquid supply mechanism can be suppressed.

An exposure apparatus according to a fourth aspect of this invention has a space between a projection optical system and a substrate that is filled with liquid, and exposes the substrate by projecting an image of a pattern onto the substrate via the projection optical system and the liquid. The exposure apparatus includes a liquid supply mechanism provided with a liquid supply flow path that supplies the liquid. In addition, the liquid supply mechanism is provided with a cut-off portion that cuts off the liquid supply flow path at the time of an abnormality. Thus, even when there is an abnormality, deterioration of mechanical parts and electrical parts in the vicinity of the substrate due to the liquid can be suppressed.

An exposure apparatus according to a fifth aspect of this invention has a space between a projection optical system and a substrate that is filled with liquid, and exposes the substrate by projecting an image of a pattern onto the substrate via the projection optical system and the liquid. The exposure apparatus includes a liquid supply mechanism that supplies liquid, and the liquid supply mechanism is provided with a sensor that detects liquid that remains in a liquid supply flow path when power supply is stopped. When power supply is stopped, the sensor confirms whether liquid exists in the liquid supply flow path. Thus, if the sensor confirms that the liquid exists, by recovering the liquid, a problem in which the liquid leaks onto the substrate from the liquid supply mechanism can be suppressed.

A liquid recovery device according to an aspect of this invention includes a liquid recovery mechanism supplied with power from a first power source and recovers liquid supplied to the substrate. The liquid recovery device also includes a second power source that supplies power to the liquid recovery mechanism at least when the first power source is abnormal. Thus, even when there is an abnormality in the first power source, the liquid supplied to the substrate can be recovered, and deterioration of mechanical parts and electrical parts in the vicinity of the substrate can be suppressed.

An exposure method according to an aspect of this invention supplies liquid between a projection optical system and a substrate, and exposes a pattern onto the substrate via the projection optical system and the liquid. The method includes the steps of recovering the liquid by using a liquid recovery mechanism supplied with power from a first power source, and recovering the liquid using the liquid recovery mechanism supplied with power from a second power source different from the first power source at least when the first power source is abnormal. When there is an abnormality in the first power source, the second power source supplies the power to the liquid recovery mechanism. Thus, even when there is an abnormality in the first power source, the liquid supplied to the substrate can be recovered, and deterioration of mechanical parts and electrical parts in the vicinity of the substrate can be suppressed.

An exposure apparatus according to another aspect of this invention exposes an image of a pattern onto a substrate using a projection optical system, and includes a liquid supply mechanism having a supply path that supplies liquid between the projection optical system and the substrate. In addition, a suction portion having a suction path that draws the liquid is disposed in the liquid supply mechanism. The suction portion draws the liquid of the liquid supply mechanism via the suction path. Thus, even when there is an abnormality in the liquid supply mechanism and/or the main body of the exposure apparatus, a problem in which the liquid leaks from the liquid supply mechanism can be suppressed. Because of this, deterioration of mechanical parts and electrical parts in the vicinity of the substrate can be avoided.

An exposure method according to another aspect of this invention uses a liquid supply mechanism to supply liquid between a projection optical system and a substrate and exposes an image of a pattern onto the substrate using the projection optical system. The method includes the step of drawing the liquid from the liquid supply mechanism in response to a processing state of the exposure. Thus, when there is an abnormality in the liquid supply mechanism, a problem in which deterioration of mechanical parts and electrical parts in the vicinity of the substrate can be suppressed.

Embodiments implementing one or more aspects of the invention are now described. However, the invention is not limited to these embodiments.

According to one or more aspects of this invention, when an abnormality such as a power outage occurs, out-flow of the liquid can be suppressed, and occurrence of problems due to out-flow of the liquid can be suppressed. Furthermore, when liquid does not need to be supplied, a problem in which the liquid leaks from the liquid supply mechanism can be suppressed. Therefore, a pattern can be accurately transferred onto the substrate, and a device with high pattern precision can be manufactured.

FIG. 1 is a schematic structural view showing an exposure apparatus of one embodiment. In FIG. 1, an exposure apparatus EX includes a mask stage MST that supports a mask M, a substrate stage PST that supports a substrate P, an illumination optical system IL that illuminates the mask M supported by the mask stage MST with exposure light EL, a projection optical system PL that projects and exposes an image of a pattern of the mask M illuminated by the exposure light EL onto the substrate P supported by the substrate stage PST, and a controller CONT that controls the overall operation of the entire exposure apparatus EX. Additionally, a chamber shown by dotted lines of FIG. 1 stores at least the mask stage MST, the substrate stage PST, the illumination optical system IL, and the projection optical system PL, and predetermined humidity and temperature are maintained in the chamber. The entire exposure apparatus EX is driven by power supplied from a commercial power source (first power source) 100 such as a power company located outside of the chamber.

The exposure apparatus EX of this embodiment is a liquid immersion exposure apparatus, in which a liquid immersion method is used to substantially widen the depth of focus as well as improve the resolution by substantially shortening the exposure wavelength, and includes a liquid supply mechanism 10 that supplies liquid 1 onto the substrate P and a liquid recovery mechanism 20 that recovers the liquid 1 from the substrate P. The exposure apparatus EX uses the liquid 1 supplied from the liquid supply mechanism 10 to form a liquid immersion region AR2 at a part of the substrate P that includes a projection region AR1 of the projection optical system PL. In the exposure apparatus EX, the space between an end surface 2*a* of an optical element 2 located at a leading end portion (end portion) of the projection optical system PL and a surface of the substrate P is filled with the liquid 1, and exposure apparatus EX exposes the substrate P by projecting an image of the pattern of the mask M onto the substrate P through the projection optical systems PL and through the liquid 1 between the projection optical system PL and the substrate P.

In this embodiment, an explanation is given with an example using a scanning type exposure apparatus (a so-called scanning stepper), as the exposure apparatus EX, that exposes a pattern formed on the mask M onto the substrate P while synchronously moving the mask M and substrate P in mutually different directions (opposite directions) in the scanning direction. In the following description, the direction that matches an optical axis AX of the projection optical system PL is designated as a Z axis direction, a direction (scanning direction) of the synchronous movement by the mask M and the substrate P in a plane perpendicular to the Z axis direction is designated as an X axis direction, and the direction (non-scanning direction) perpendicular to the Z axis direction and perpendicular to the X axis direction is designated as a Y axis direction. Furthermore, the rotation (inclination) directions about the X axis, the Y axis, and the Z axis are designated as θX, θY, and θZ directions, respectively. The term "substrate" includes anything on which a photoresist, which is a photosensitive material, is applied, and the term "mask" includes a reticle on which a device pattern to be reduced and projected onto the substrate is formed.

The illumination optical system IL illuminates the mask M supported by the mask stage MST with the exposure light EL, and has an exposure light source that emits the exposure light EL, an optical integrator that uniformizes the intensity of the exposure light EL emitted from the exposure light source, a condenser lens that collects the exposure light EL from the optical integrator, a relay lens system, a variable field stop that sets an illumination region on the mask M by the exposure light EL in a slit shape, etc. The predetermined illumination region on the mask M is illuminated with the exposure light EL having a uniform intensity distribution by the illumination optical system IL. For example, the exposure light EL emitted from the exposure light source may be a bright line (g-line, h-line, i-line) in the ultraviolet region emitted from a mercury lamp, far ultraviolet light (DUV light), such as a KrF excimer laser light (wavelength: 248 nm), and vacuum ultraviolet light (VUV light), such as an ArF excimer laser light (wavelength: 193 nm) and an $F_2$ laser light (wavelength: 157 nm). In this embodiment, the ArF excimer laser is used.

In this embodiment, distilled water is used as the liquid 1 that is supplied from the liquid supply mechanism 10. The distilled water can transmit not only the ArF excimer laser light but also, for example, the bright lines (g-line, h-line, i-line) in the ultraviolet region emitted from a mercury lamp, and far ultraviolet light (DUV light), such as KrF excimer laser light (wavelength: 248 nm).

The mask stage MST supports the mask M and can be two-dimensionally moved within a plane perpendicular to the optical axis AX of the projection optical system PL, that is, within the XY plane and can be micro-rotated in the θZ direction. The mask stage MST is driven by a mask stage drive device MSTD such as a linear motor. The mask stage drive device MSTD is controlled by the controller CONT. The position and rotation angle of the mask M in the two-dimensional direction on the mask stage MST are measured by an undepicted laser interferometer in real time, and the measurement result is output to the controller CONT. The controller CONT positions the mask M that is supported on the mask stage MST by driving the mask stage drive device MSTD based on the measurement result of the laser interferometer.

The projection optical system PL projects and exposes a pattern of the mask M onto the substrate P at a predetermined projection magnification β, and is constituted by a plurality of optical elements (lenses, etc.) that are supported by a lens barrel PK. In this embodiment, the projection optical system PL is a reduction inversion system, in which the projection magnification β is ¼ or ⅕, for example. Alternatively, the projection optical system PL can be either a unity system or a magnifying system. Furthermore, the projection optical system PL can be not only a dioptric system but also a catadioptric system or a reflective system, and can form either an inverted image or an erect image. In addition, on the front end side (substrate P side) of the projection optical system PL of this embodiment, the optical element 2 extends from the lens barrel PK, and is detachably (replaceably) provided to the lens barrel PK. The substrate stage PST supports the substrate P and is provided with a Z stage (substrate holder) 51 that holds the substrate P via a substrate holder, an XY stage 52 that supports the Z stage 51, and a base 53 that supports the XY stage 52. The substrate stage PST is driven by the substrate stage drive device PSTD such as a linear motor. The substrate stage drive device PSTD is controlled by the controller CONT. By driving the Z stage 51, the position (focus position) of the substrate P in the Z axis direction supported by the Z stage 51 and the position in the θX and θY directions are controlled. Furthermore, by driving the XY stage 52, the position of the substrate P in the XY directions (position in the direction substantially parallel to an image plane of the projection optical system PL) is controlled. That is, by controlling the focus position and the inclination angle, the Z stage 51 matches the surface of the substrate P with the image plane of the projection optical system PL by an auto focus method and an auto leveling method. The XY stage 52 positions the substrate P in the X axis direction and in the Y axis direction. Furthermore, the Z stage and the XY stage can be integrated.

Moving mirrors 45 are arranged on the substrate stage PST. Furthermore, laser interferometers 46 are arranged at positions opposing the moving mirrors 45. The position of the substrate P on the substrate stage PST in the two-dimensional directions and the rotation angle about the axes are measured by the laser interferometers 46 in real time, and the measurement results are output to the controller CONT. The controller CONT positions the substrate P, which is supported on the substrate stage PST, by driving the substrate stage drive device PSTD based on the measurement result of the laser interferometers 46.

Furthermore, on the substrate stage PST (Z stage 51), an auxiliary plate 43 is arranged so as to surround the substrate P. The auxiliary plate 43 is located substantially in the same plane as the surface of the substrate P that is held on the Z stage (substrate holder). When the edge region of the substrate P is exposed, the liquid 1 can be held under the projection optical system PL by the auxiliary plate 43.

Furthermore, on the Z stage 51, outside the auxiliary plate 43, a recovery port 61 of a second liquid recovery mechanism 60 is arranged, which recovers the liquid 1 that flows to the outside of the substrate P. The recovery port 61 is an annular groove portion that is formed so as to surround the auxiliary plate 43. A liquid absorption member 62 formed of a sponge member, a porous body, etc. is arranged therein.

Figure 2:
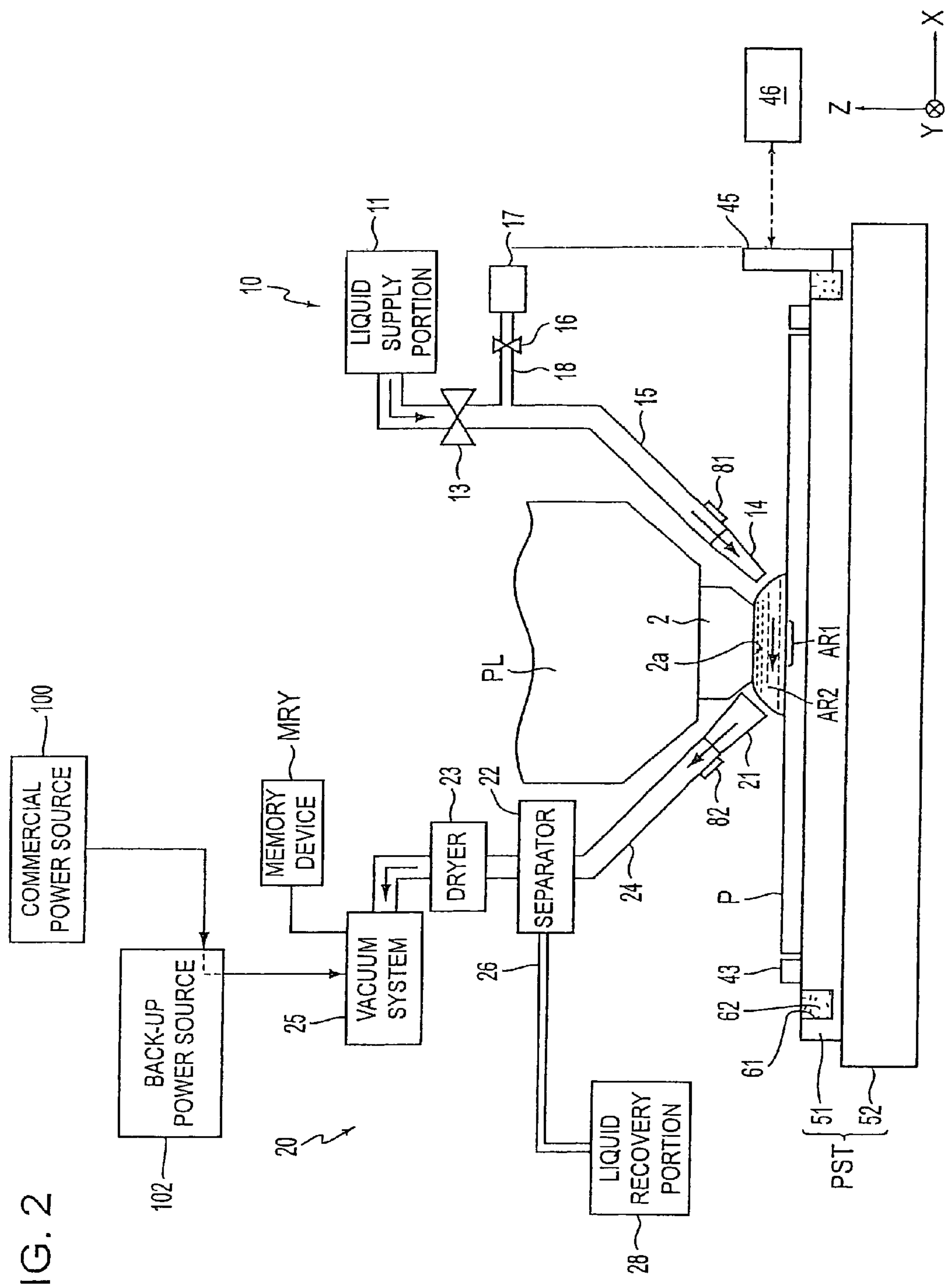
FIG. 2 is a diagram showing a positional relationship between a leading end portion of a projection optical system, a liquid supply mechanism, and a liquid recovery mechanism.

FIG. 2 is an enlarged diagram showing the liquid supply mechanism 10, the liquid recovery mechanism 20, and the vicinity of the leading end portion of the projection optical system PL. The liquid supply mechanism 10 supplies the liquid 1 between the projection optical system PL and the substrate P, and is provided with a liquid supply portion 11 that can eject the liquid 1, and a supply nozzle 14 that is connected to the liquid supply portion 11 via a supply tube 15 and supplies the liquid ejected from the liquid supply portion 11 onto the substrate P. The supply nozzle 14 is arranged near the surface of the substrate P. The liquid supply portion 11 is provided with a tank for storing the liquid 1, a pressure pump, etc. The liquid 1 is supplied onto the substrate P via the supply tube 15 and the supply nozzle 14. The liquid supply operation of the liquid supply portion 11 is controlled by the controller CONT, and the controller CONT can control the liquid supply amount per unit time onto the substrate P by the liquid supply portion 11. It is also acceptable to use a factory-wide liquid supply system, without providing the dedicated liquid supply portion 11 on the exposure apparatus.

In the supply tube 15, a valve (cut-off portion) 13 is arranged, which opens and closes a flow path of the supply tube 15. The open/close operation of the valve 13 is controlled by the controller CONT. In addition, the valve 13 of this embodiment is a so-called normally closed type that mechanically cuts off the liquid supply flow path of the supply tube 15 when the drive source (commercial power source 100) of the exposure apparatus EX (and of the controller CONT) stops due to, for example, a power outage, etc.

Additionally, one end portion of a suction tube 18 is connected (joined) between the valve 13 and the supply nozzle 14 in the supply tube 15, and another end portion of the suction tube 18 is connected to a third liquid recovery mechanism 17. In the suction tube 18, a valve 16 is arranged which opens and closes a flow path of the suction tube 18. The one end portion of the suction tube 18 joins the liquid supply flow path of the supply tube 15 at a position immediately downstream of the valve 13.

The liquid recovery mechanism 20 recovers the liquid 1 on the substrate P that has been supplied by the liquid supply mechanism 10 and is provided with a recovery nozzle 21 arranged in the vicinity of the surface of the substrate P, and a vacuum system 25 connected to the recovery nozzle 21 via a recovery tube 24. The vacuum system 25 is constituted by a vacuum pump, and the operation is controlled by the controller CONT. As the vacuum system 25 is driven, the liquid 1 on the substrate P is recovered via the recovery nozzle 21 along with ambient gas (air). In addition, a vacuum system for the factory in which the exposure apparatus EX is arranged may be used as the vacuum system 25, without providing a dedicated vacuum pump in the exposure apparatus.

A gas-liquid separator 22 that separates the liquid 1 and the gas drawn by the recovery nozzle 21 is provided in the recovery tube 24. As described above, the liquid 1 on the substrate P and ambient gas are recovered from the recovery nozzle 21. The gas-liquid separator 22 separates the liquid 1 and the gas recovered by the recovery nozzle 21. For the gas-liquid separator 22, for example, a gravity separation method that separates the liquid from the gas by communicating the recovered liquid and gas in a tube member having a plurality of holes and dropping the liquid through the holes, using gravity, or a centrifugal separation method that separates the recovered liquid and gas using centrifugal force, may be used. The vacuum system 25 draws the gas separated by the gas-liquid separator 22.

A dryer 23 that dries the gas separated by the gas-liquid separator 22 is provided in the recovery tube 24, between the vacuum system 25 and the gas-liquid separator 22. Even if liquid particles are mixed in the gas separated by the gas-liquid separator 22, occurrence of trouble such as failure of the vacuum system 25 due to entry of the liquid particles, can be suppressed by drying the gas using the dryer 23 and by causing the dried gas to flow into the vacuum system 25. For the dryer 23, a method for removing the liquid particles by cooling the gas supplied by the gas-liquid separator 22 (gas in which the liquid particles are mixed) to or below the dew point of the liquid, or a method for removing the liquid particles by heating the gas to or above the boiling point of the liquid may be used.

Meanwhile, the liquid 1 separated by the gas-liquid separator 22 is recovered in a liquid recovery portion 28 via a second recovery tube 26. The liquid recovery portion 28 is provided with a tank, etc. that stores the recovered liquid 1. The liquid 1 recovered by the liquid recovery portion 28 is, for example, discarded or recycled and returned to the liquid supply portion 11, etc. after being cleaned.

A back-up power source 102 that supplies power to the drive portion of the liquid recovery mechanism 20 when the commercial power source 100 stops supplying power, is connected to the liquid recovery mechanism 20. Even when a power source trouble occurs such as power outage, voltage fluctuation, etc., the back-up power source 102 (in this embodiment, a UPS: Uninterruptible Power System) supplies stabilized power from a battery arranged inside the device. In this embodiment, in order to avoid the effects of heat from the back-up power source 102, the back-up power source 102 is arranged outside of the chamber. In this embodiment, when the commercial power source 100 stops supplying power, the back-up power source 102 supplies power to a power drive portion of the vacuum system 25, a power drive portion of the separator 22, and a power drive portion of the dryer 23, of the liquid recovery mechanism 20. Furthermore, the back-up power source 102 can supply power to the respective power drive portions along with the commercial power source 100, and can supply power to the respective power drive portions in response to voltage fluctuations of the commercial power source 100. Furthermore, the back-up power source 102 can be arranged within the chamber.

A liquid sensor 81 that detects whether liquid 1 exists in the supply tube 15 (whether liquid 1 flows through the supply tube 15) is arranged in the supply tube 15. The liquid sensor 81 is arranged in the vicinity of the supply nozzle 14 of the supply tube 15. Furthermore, a liquid sensor 82 that detects whether liquid 1 exists in the recovery tube 24 (whether the liquid 1 flows through the recovery tube 24) is arranged in the recovery tube 24. The liquid sensor 82 is arranged in the vicinity of the recovery nozzle 21 of the recovery tube 24. In this embodiment, each liquid sensor 81 (82) optically detects the liquid 1. For example, by forming the supply tube 15 (and the recovery tube 24) from a transparent member and mounting the liquid sensor 81 (82) outside of the supply tube 15 (and the recovery tube 24), the liquid sensor 81 (82) can detect whether the liquid 1 flows through the supply tube 15 (and the recovery tube 24) formed of the transparent member. Furthermore, the liquid sensors 81, 82 are driven by power that is supplied from the commercial power source 100, but when the commercial power source 100 stops supplying power, it is driven by power that is supplied by the back-up power source 102.

Additionally, a memory device MRY that stores various information relating to liquid immersion exposure processing, including information concerning the liquid 1, is arranged in the liquid recovery mechanism 20. As described later, when the commercial power source 100 stops supplying power, the liquid recovery mechanism 20 is driven based on the memory information of the memory device MRY.

Figure 3:
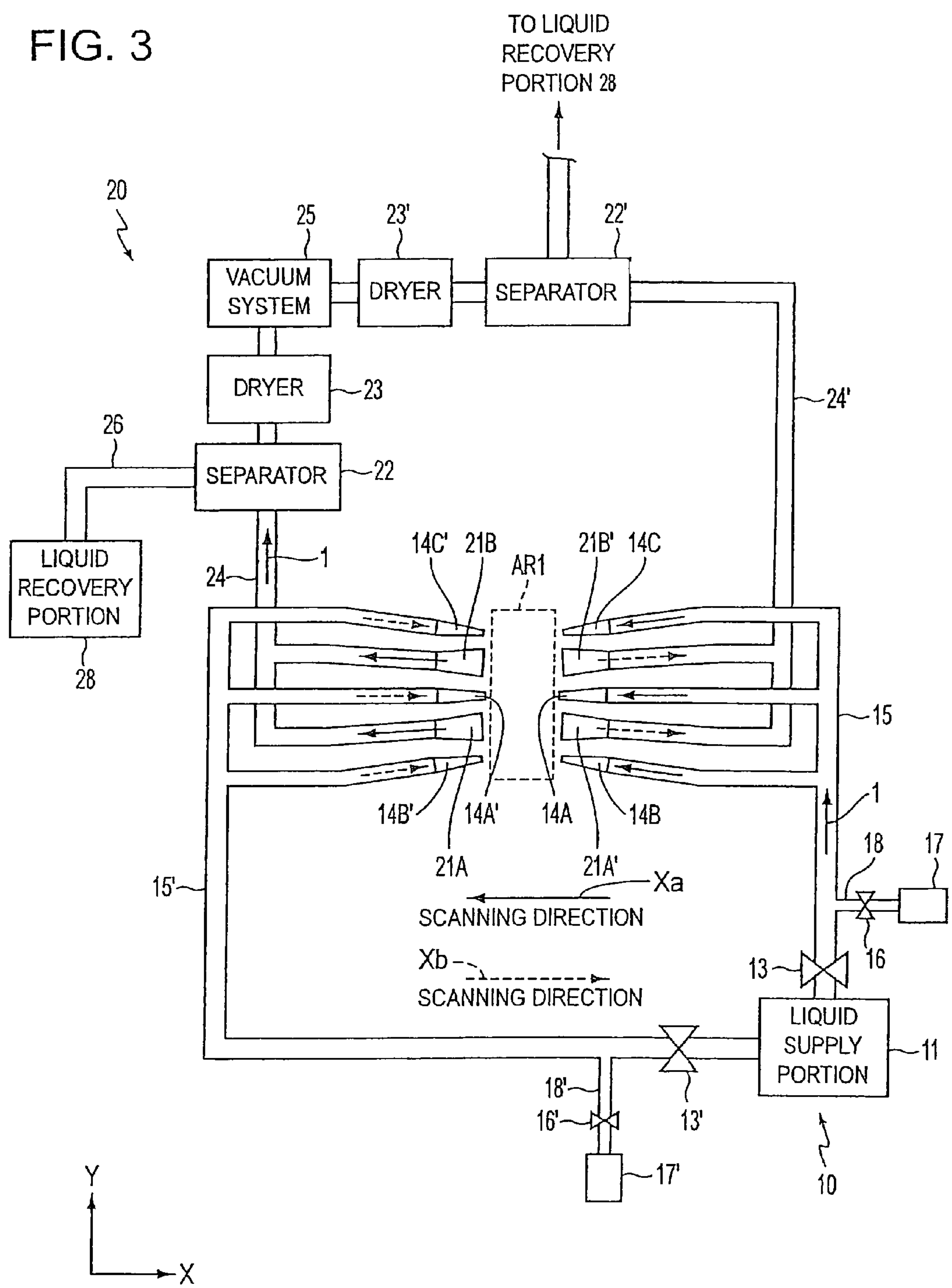
FIG. 3 is a diagram showing an exemplary arrangement of supply nozzles and recovery nozzles.

FIG. 3 is a plan view showing the positional relationship between the liquid supply mechanism 10, the liquid recovery mechanism 20, and the projection region AR1 of the projection optical system PL. The projection region AR1 of the projection optical system PL is a rectangular shape (slit shape) that is elongated in the Y axis direction. Three supply nozzles 14A-14C are arranged on the +X side, and two recovery nozzles 21A and 21B are arranged on the −X side, so as to sandwich the projection region AR1 in the X axis direction. Furthermore, the supply nozzles 14A-14C are connected to the liquid supply portion 11 via the supply tube 15, and the recovery nozzles 21A and 21B are connected to the vacuum system 25 via the recovery tube 24. In addition, supply nozzles 14A'-14C' and recovery nozzles 21A' and 21B' are arranged so as to have the positional relationship in which the supply nozzles 14A-14C and the recovery nozzles 21A and 21B are rotated by substantially 180°. The supply nozzles 14A-14C and the recovery nozzles 21A' and 21B' are alternately arranged in the Y axis direction, and the supply nozzles 14A'-14C' and the recovery nozzles 21A and 21B are alternately arranged in the Y axis direction. The supply nozzles 14A'-14C' are connected to the liquid supply portion 11 via the supply tube 15', and the recovery nozzles 21A' and 21B' are connected to the vacuum system 25 via a recovery tube 24'. In the same manner as the supply tube 15, a valve 13' is provided in the supply tube 15', and the supply tube 15' is connected to a third liquid recovery mechanism 17' by a suction tube 18' having a valve 16' therein. Furthermore, in the same manner as the suction tube 24, a gas-liquid separator 22' and a dryer 23' are provided in the recovery tube 24'.

The configuration of the above-described nozzles is not particularly limited. For example, the supply and recovery of the liquid 1 may be performed by two pairs of nozzles provided at the long sides of the projection region AR1. In this case, the supply nozzles and the recovery nozzles may be horizontally arranged so that the liquid 1 can be supplied and recovered in either the +X direction or the −X direction.

Figure 4:
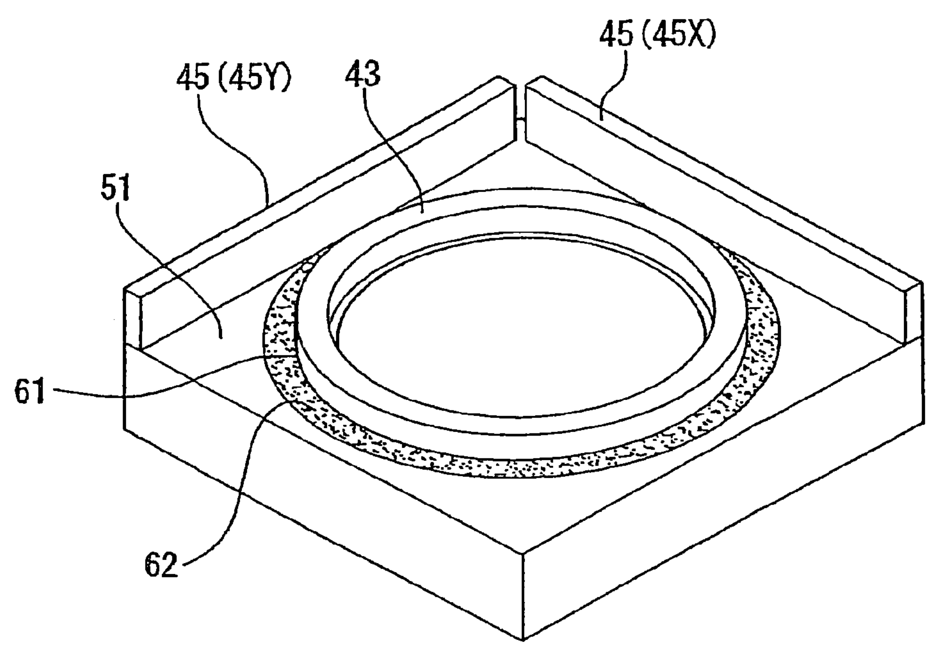
FIG. 4 is a schematic perspective view of a substrate stage.
Figure 5:
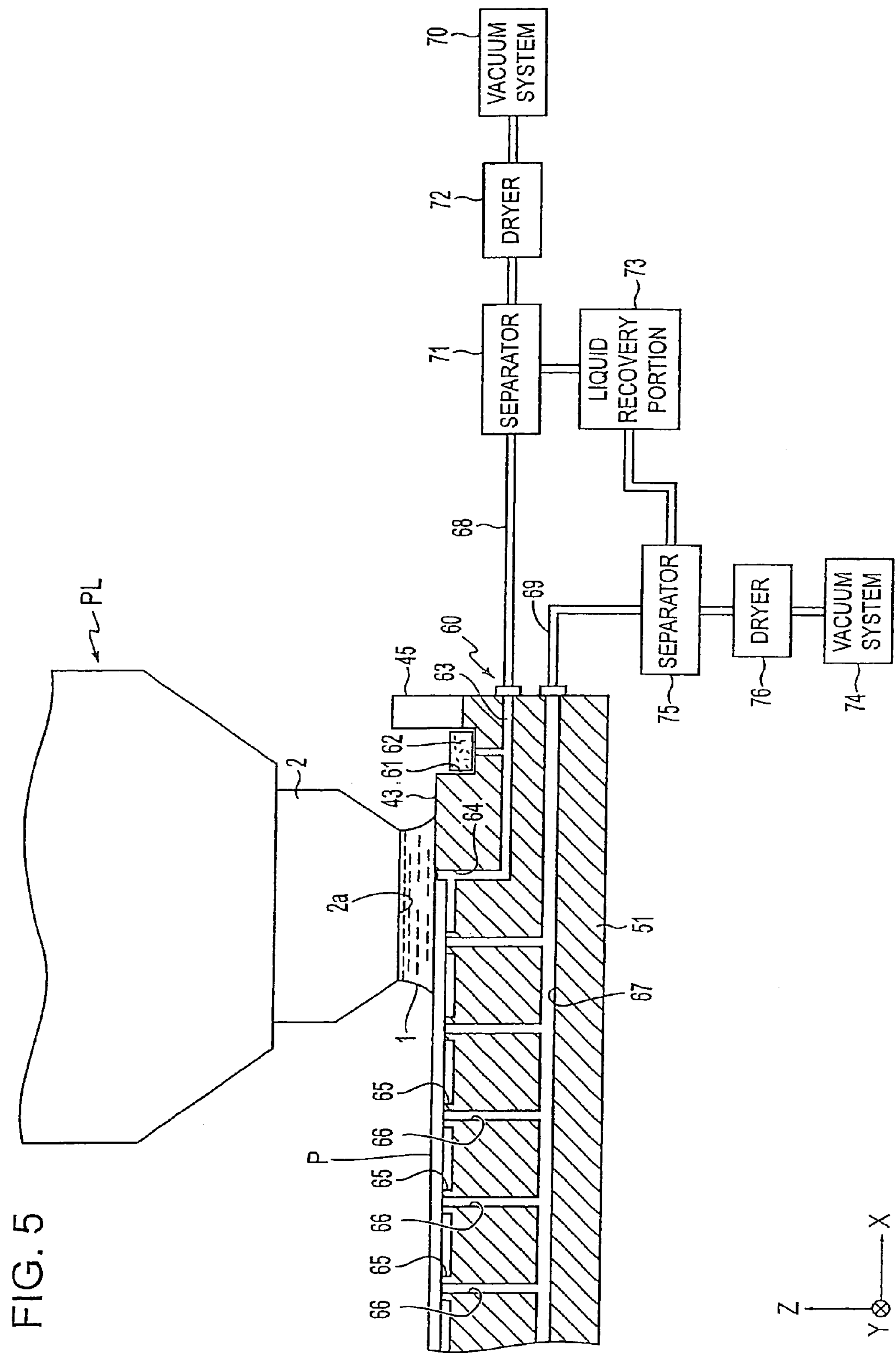
FIG. 5 is an enlarged cross-sectional view showing a main portion of an embodiment of a second liquid recovery mechanism.

FIG. 4 is a perspective view of the Z stage 51. FIG. 5 is an enlarged cross-sectional view showing a main portion of a second liquid recovery mechanism 60 arranged on the Z stage 51. The second liquid recovery mechanism 60 recovers the liquid 1 that flows to the outside of the substrate P and includes a recovery port 61 that is annularly formed so as to surround the auxiliary plate 43 on the Z stage (substrate holder) 51 and a liquid absorption member 62 arranged in the recovery port 61 and formed of a porous body such as a sponge member, a porous ceramic, etc. The liquid absorption member 62 is an annular member having a predetermined width and can hold a predetermined amount of the liquid 1. The liquid absorption member 62 that is arranged so as to surround the outer circumference of the auxiliary plate 43 at a predetermined spacing functions to absorb (recover) the liquid 1 that cannot be recovered by the liquid recovery mechanism 20 alone and that flows to the outside of the auxiliary plate 43. A flow path 63 that communicates with the recovery port 61 is formed within the Z stage 51, and the bottom portion of the liquid absorption member 62 arranged in the recovery port 61 communicates with the flow path 63. Furthermore, a plurality of liquid recovery holes 64 are arranged between the substrate P and the auxiliary plate 43 on the Z stage 51. The liquid recovery holes 64 are connected to the flow path 63.

A plurality of protrusions 65 that support the rear surface of the substrate P are arranged on the top surface of the Z stage (substrate holder) 51 that holds the substrate P. Adsorption holes 66 that adsorb and hold the substrate P are arranged in the protrusions 65, respectively. The respective adsorption holes 66 are connected to a flow path 67 formed inside the Z stage 51.

The flow path 63 connected to the recovery port 61 and the liquid recovery holes 64 is connected to one end portion of a tube path 68 arranged outside of the Z stage 51. Meanwhile, the other end portion of the tube path 68 is connected to a vacuum system 70 including a vacuum pump. A gas-liquid separator 71 is arranged in the tube path 68. A dryer 72 is arranged between the gas-liquid separator 71 and the vacuum system 70. The liquid 1 from the recovery port 61 is recovered along with the ambient gas by driving the vacuum system 70. A gas that is separated by the gas-liquid separator 71 and dried by the dryer 72 flows into the vacuum system 70. Meanwhile, the liquid 1 separated by the gas-liquid separator 71 flows into a liquid recovery portion 73 provided with a tank, etc. that can store the liquid 1. In addition, the liquid 1 recovered by the liquid recovery portion 73 is, for example, discarded or recycled and returned to the liquid supply portion 11, etc. after being cleaned.

Furthermore, the flow path 67 connected to the adsorption holes 66 is connected to one end portion of a tube path 69 arranged outside of the Z stage 51. Meanwhile, the other end portion of the tube path 69 is connected to a vacuum system 74 including a vacuum pump arranged outside of the Z stage 51. By driving the vacuum system 74, the substrate P supported by the protrusions 65 is adsorbed and held by the adsorption holes 66. A gas-liquid separator 75 is arranged in the tube path 69, and a dryer 76 is arranged between the gas-liquid separator 75 and the vacuum system 74. Furthermore, the liquid recovery portion 73 provided with a tank, etc. that can store the liquid 1 is connected to the gas-liquid separator 75. Even if the liquid 1 enters from between the substrate P and the auxiliary plate 43 and flows to the rear surface side of the substrate P, the liquid can be recovered with the ambient gas from the adsorption holes 66.

In addition, in FIG. 4, on the +X side end portion of the Z stage 51, a moving mirror 45X is arranged which extends in the Y axis direction, and on the Y side end portion, a moving mirror 45Y is arranged which extends in the X axis direction. Laser interferometers detect the position of the substrate stage PST in the X axis direction and in the Y axis direction by irradiating laser beams onto the moving mirrors 45X, 45Y.

The following explains a procedure for exposing a pattern of the mask M onto the substrate P by using the above-described exposure apparatus EX.

After the mask M is loaded onto the mask stage MST and the substrate P is loaded onto the substrate stage PST, the controller CONT drives the liquid supply portion 11 of the liquid supply mechanism 10 and supplies a predetermined amount of the liquid 1 per unit time onto the substrate P via the supply tube 15 and the supply nozzle 14. At this time, the liquid supply flow path of the supply tube 15 is opened, and the flow path of the suction tube 18 is closed by the valve 16. In addition, the controller CONT drives the vacuum system 25 of the liquid recovery mechanism 20 in accordance with the supply of the liquid 1 by the liquid supply mechanism 10, and recovers a predetermined amount of the liquid 1 per unit time via the recovery nozzle 21 and the recovery tube 24. As a result, the liquid immersion region AR2 of the liquid 1 is formed between the optical element 2 at the front end portion of the projection optical system PL and the substrate P. At this time, the entire exposure apparatus EX is driven by power that is supplied by the commercial power source 100. Here, in order to form the liquid immersion region AR2, the controller CONT controls the liquid supply mechanism 10 and the liquid recovery mechanism 20 so that the amount of the liquid supplied to the substrate P and the amount of liquid recovered from the substrate P become substantially the same amount. In addition, the controller CONT performs control so that the exposure apparatus EX illuminates the mask M with the exposure light EL by the illumination optical system IL and projects an image of the pattern of the mask M onto the substrate P via the projection optical system PL and the liquid 1.

At the time of scanning exposure, a portion of a pattern image on the mask M is projected onto the projection region AR1. With respect to the projection optical system PL, synchronous to the mask M moving in the −X direction (or +X direction) at a velocity V, the substrate P moves in the +X direction (or −X direction) at a velocity $\beta \cdot V$ ($\beta$ is a projection magnification) via the substrate stage PST. Then, after exposure is completed in one shot region, the next shot region is moved to a scanning start position by stepping of the substrate P. Hereafter, the exposure processing for each shot region is sequentially performed by a step-and-scan method. This embodiment is set so that the liquid 1 flows in a direction parallel to the direction of movement of the substrate P, that is, in the same direction as the direction of the movement of the substrate P. In other words, when performing the scanning exposure by moving the substrate P in the scanning direction (−X direction) shown by an arrow Xa (see FIG. 3), the supply and recovery of the liquid 1 by the liquid supply mechanism 10 and the liquid recovery mechanism 20 are performed by using the supply tube 15, the supply nozzles 14A-14C, the recovery tube 24, and the recovery nozzles 21A and 21B. That is, when the substrate P moves in the −X direction, the liquid 1 is supplied between the projection optical system PL and substrate P by the supply nozzle 14 (14A-14C), the liquid 1 on the substrate P is recovered by the recovery nozzle 21 (21A and 21B) along with the ambient gas, and the liquid 1 flows in the −X direction so as to fill the space between the optical element 2 at the front end portion of the projection optical system PL and the substrate P. Meanwhile, when performing the scanning exposure by moving the substrate P in the scanning direction (+X direction) shown by an arrow Xb (see FIG. 3), the supply and recovery of the liquid 1 by the liquid supply mechanism 10 and the liquid recovery mechanism 20 are performed by using the supply tube 15', the supply nozzles 14A'-14C', the recovery tube 24', and the recovery nozzles 21A' and 21B'. That is, when the substrate P moves in the +X direction, the liquid 1 is supplied between the projection optical system PL and substrate P by the supply nozzle 14' (14A'-14C'), the liquid 1 on the substrate P is recovered by the recovery nozzle 21' (21A' and 21B') along with the ambient gas, and the liquid 1 flows in the +X direction so as to fill the space between the optical element 2 at the front end portion of the projection optical system PL and the substrate P. In this case, the liquid 1 that is supplied via the supply nozzle 14 flows as if it were drawn to the space between the optical element 2 and the substrate P in accordance with the movement of the substrate P in the −X direction. Therefore, even if the supply energy of the liquid supply mechanism 10 (liquid supply portion 11) is small, the liquid 1 can be easily supplied between the optical element 2 and the substrate P. Then, by switching the direction of the flow of the liquid 1 according to the scanning direction, when the substrate P is scanned in either the +X direction or the −X direction, the space between the optical element 2 and the substrate P can be filled with the liquid 1. Therefore, a high resolution and a wide depth of focus can be obtained.

While the shot region near the center of the substrate P is exposed, the liquid 1 supplied from the liquid supply mechanism 10 is recovered by the liquid recovery mechanism 20. Meanwhile, as shown in FIG. 5, when the liquid immersion region AR2 is in the vicinity of the edge region of the substrate P due to exposure-processing the edge region of the substrate P, the liquid 1 can be maintained between the projection optical system PL and the substrate P by the auxiliary plate 43, but there is a case in which part of the liquid 1 flows to the outside of the auxiliary plate 43. The liquid 1 thus discharged is recovered by the recovery port 61 in which the liquid absorption member 62 is arranged. Here, the controller CONT starts an operation of the second liquid recovery mechanism 60 along with driving the liquid supply mechanism 10 and the liquid recovery mechanism 20. Therefore, the liquid 1 recovered by the recovery port 61 is recovered by suction of the vacuum system 70 via the flow path 63 and the tube path 68, along with ambient air. Furthermore, the liquid 1 that has flowed into the gap between the substrate P and the auxiliary plate 43 is recovered via the flow path 63 and the tube path 68, along with the ambient air, via the liquid recovery holes 64. At this time, the separator 71 separates the liquid 1 and the gas recovered through the recovery port 61 and the recovery holes 64. The gas separated by the separator 71 flows into the vacuum system 70 after being dried by the dryer 72. By doing this, a problem can be suppressed in which the liquid component flows into the vacuum system 70. Meanwhile, the liquid separated by the separator 71 is recovered by the liquid recovery portion 73.

There may be a case in which the liquid 1 discharged outside of the substrate P enters from the gap between the substrate P and the auxiliary plate 43 and reaches the rear surface side of the substrate P. Additionally, there is also a possibility that the liquid 1 that entered the rear surface side of the substrate P flows into the adsorption holes 66 that adsorb and hold the substrate P. In this case, the adsorption holes 66 arranged in the Z stage 51 so as to adsorb and hold the substrate P are connected to the vacuum system 74 via the flow path 67 and the tube path 69. In the tube path 69, the gas-liquid separator 75 and the dryer 76 that dries the gas separated by the gas-liquid separator 75 are arranged. Therefore, even if the liquid 1 enters the adsorption holes 66, a problem can be suppressed in which the liquid component enters the vacuum system 74.

Meanwhile, in the exposure apparatus EX of this embodiment, each power drive portion constituting the exposure apparatus EX including the liquid supply mechanism 10, the liquid recovery mechanism 20, and the second liquid recovery mechanism 60 is driven by power supplied from the commercial power source 100. However, when the commercial power source 100 stops supplying power, the supply of the power for the drive portion of the liquid recovery mechanism 20 is switched to the back-up power source 102. The following explains the operation of the exposure apparatus EX when the commercial power source 100 stops supplying power.

When the commercial power source 100 stops supplying power, as described before, the back-up power source 102 continuously supplies power by switching the power source supply for the liquid recovery mechanism 20 to, for example, a built-in battery. After that, the back-up power source 102 activates a built-in generator, in case the power outage continues for many hours, and the power supply for the liquid recovery mechanism 20 is switched from the battery to the generator. At this time, the back-up power source 102 performs power supply for at least the vacuum system 25, the separator 22, and the dryer 23 of the liquid recovery mechanism 20. By doing this, even if the commercial power source 100 stops supplying power, the power supply for the liquid recovery mechanism 20 continues, and the liquid recovery operation by the liquid recovery mechanism 20 can be maintained. Furthermore, the back-up power source 102 is not limited to the above-mentioned embodiment, and any well-known back-up power source can be used. In addition, in this embodiment, a back-up power source device is used as an example of a back-up power source when the commercial power source 100 stops supplying power; however, a back-up battery can be used as a back-up power source. When the commercial power source 100 stops supplying power, the system can be switched to the battery. Furthermore, a private power generator in a factory also can be used as a back-up power source, and a capacitor also can be used as a back-up power source.

Furthermore, when the commercial power source 100 stops supplying power, the back-up power source 102 also supplies power to the second liquid recovery mechanism 60. Specifically, the back-up power source 102 supplies power to at least the vacuum system 70, the separator 71, and the dryer 72 of the second liquid recovery mechanism 60. By doing this, for example, when the commercial power source 100 stops supplying power in a state in which part of the liquid immersion region AR2 of the liquid 1 is arranged on the auxiliary plate 43, and the liquid 1 flows to the outside of the substrate P, the second liquid recovery mechanism 60 can recover the discharged liquid 1. In addition, when the commercial power source 100 stops supplying power, the back-up power source 102 can also supply the power to the vacuum system 74, the separator 75, and the dryer 76. By doing this, when the commercial power source 100 stops supplying power, adsorption and holding of the substrate P by the Z stage 51 can be maintained. Thus, the position of the substrate P is not shifted with respect to the Z stage 51 due to the power outage. Therefore, after the power recovers, when the exposure operation begins again, the restart operation of the exposure processing can be smoothly performed.

Meanwhile, when the commercial power source 100 stops supplying power, the normally closed type valve 13 arranged in the supply tube 15 of the liquid supply mechanism 10 is operated, and the liquid supply flow path of the supply tube 15 is cut off. By doing this, after the commercial power source 100 stops supplying power, there is no problem caused by the liquid 1 leaking onto the substrate P from the liquid supply mechanism 10. Furthermore, in this embodiment, when the commercial power source 100 stops supplying power, the valve 16 of the suction tube 18 is mechanically operated, the flow path of the suction tube 18 is opened, and the back-up power source 102 supplies power to the third liquid recovery mechanism 17. The third liquid recovery mechanism 17 has substantially the same function as the liquid recovery mechanism 20 and the second liquid recovery mechanism 60 and is provided with a vacuum system such as an undepicted suction pump, a dryer, a separator, and a liquid recovery portion. For example, when a suction pump of the third liquid recovery mechanism 17 is operated by the power supplied from the back-up power source 102, the liquid 1 stored in the liquid flow path on the downstream side of the valve 13 in the supply tube 15, and in the supply nozzle 14, is drawn by the suction pump of the third liquid recovery mechanism 17 via the suction tube 18. The suction tube 18 is connected to the liquid supply flow path of the supply tube 15 at a position immediately on the downstream side of the valve 13, so the liquid 1 stored in the liquid supply flow path between the valve 13 and the supply nozzle 14 of the supply tube 15 is drawn and recovered. By doing this, after the commercial power source 100 stops supplying power, a problem can be further reliably suppressed in which the liquid 1 leaks onto the substrate P from the liquid supply mechanism 10, and occurrence of a problem can be suppressed in which the liquid 1 splashes onto the substrate stage PST and in the vicinity of the substrate stage PST.

Furthermore, after the commercial power source 100 stops supplying power, the back-up power source 102 continues to supply power to the liquid recovery mechanism 20 and to the second liquid recovery mechanism 60 until the liquid 1 that remained on the substrate P and the liquid 1 that was discharged from the liquid supply mechanism 10 (supply tube 15) without being recovered by the third liquid recovery mechanism 17 are completely recovered.

For example, based on the detection result of the liquid sensor 82 arranged in the vicinity of the recovery nozzle 21 of the recovery tube 24, the liquid recovery mechanism 20 is driven by the power supplied from the back-up power source 102. Specifically, while the liquid sensor 82 detects the liquid 1, the liquid 1 (that is, the liquid 1 present on the substrate P) is recovered from the substrate P, so the liquid recovery mechanism 20 continues the drive at least until the liquid sensor 82 does not detect the liquid 1. In the same manner, liquid sensors are arranged in the tube paths 68, 69 of the second liquid recovery mechanism 60, and based on the detection result of the liquid sensors, the second liquid recovery mechanism 60 can be driven. In this case as well, the second liquid recovery mechanism 60 continues the drive until the liquid sensor does not detect the liquid 1.

Furthermore, based on the detection result of the liquid sensor 81 arranged in the vicinity of the supply nozzle 14, the third liquid recovery mechanism 17 constituting an exhaust mechanism also can be driven. For example, while the liquid sensor 81 detects the liquid 1, the liquid 1 is present in the supply tube 15, so the third liquid recovery mechanism 17 continues the drive until the liquid sensor 81 does not detect the liquid 1.

Alternatively, after the commercial power source 100 stops supplying power, information concerning the liquid amount to be discharged from the supply port of the supply nozzle 14 of the liquid supply mechanism 10 is obtained in advance by, for example, experimentation, simulation, or the like, and the obtained information is stored in a memory device MRY. Based on the stored information, the liquid recovery mechanism 20, the second liquid recovery mechanism 60, and the third liquid recovery mechanism 17 can be driven. For example, after the commercial power source 100 stops supplying power, after cutting off the liquid supply flow path of the supply tube 15 by the valve 13, the liquid amount to be recovered by driving the third liquid recovery mechanism 17 can be obtained in advance based on the volume of the liquid supply flow path of the supply tube 15. Furthermore, after the commercial power source 100 stops supplying power, the liquid amount that still remains on the substrate P is substantially the same as the liquid amount of the liquid immersion region AR2, and can be obtained in advance based on, for example, the distance between the optical element 2 of the projection optical system PL and the substrate P and the area of the liquid immersion region AR2. After the commercial power source 100 stops supplying power, the information concerning the sum of the liquid amount that still remains on the substrate P and the liquid amount that is discharged from the supply tube 15 is stored in advance in the memory device MRY. After the commercial power source 100 stops supplying power, the liquid recovery mechanism 20 and the second liquid recovery mechanism 60 continue the recovery operation at least until the sum of the recovered liquid amount reaches the sum of the liquid amount stored in the memory device MRY.

Furthermore, after the commercial power source 100 stops supplying power, for example, the second liquid recovery mechanism 60 may be made to have a greater rate of liquid recovery than before the power supply was stopped. Specifically, the drive amount (drive force) of the vacuum system of the second liquid recovery mechanism 60 may be increased. The driving of the second liquid recovery mechanism (vacuum system) becomes a vibration source, so it is preferable that the drive force of the second liquid recovery mechanism decreases or stops during exposure processing. However, after the commercial power source 100 stops supplying power, the exposure processing also stops. Therefore, by increasing the drive force of the vacuum system when it is supplied with power from the back-up power source 102, the second liquid recovery mechanism 60 suppresses leakage of the liquid 1 to the outside of the substrate stage PST (at least outward from the recovery port 61), or suppresses the spread of leakage.

Additionally, when the commercial power source 100 is abnormal, there is a possibility that humidity and temperature of the chamber cannot be controlled, and particularly the performance capability of the projection optical system PL may be deteriorated. Because of this, the power of the back-up power source 102 also can be supplied to devices controlling the atmosphere (humidity and temperature) of the chamber. Furthermore, when the commercial power source 100 is abnormal, the power also can be supplied to the chamber-controlling devices by using another back-up power source (third power source) different from the back-up power source 102. In this case, a chamber can be divided into a plurality of regions, and the power also can be supplied to the device(s) controlling the chamber storing at least the projection optical system PL. By doing this, immediately after the commercial power source 100 recovers, the exposure apparatus EX can be promptly operated, and the negative effects due to an abnormality of the commercial power source 100 can be minimized. In addition, the power of the back-up power source 102 also can be supplied to an undepicted local temperature adjusting device in which the temperature of the projection optical system PL is locally adjusted. In this case, it is acceptable to supply power by the back-up power source 102 to the devices controlling the chamber atmosphere, and it also is acceptable not to do so.

Furthermore, it is not necessary to provide one back-up power source 102 (and another back-up power source (third power source)) for each exposure apparatus, because one back-up power source 102 can be used with a plurality of exposure apparatus. By doing this, the number of back-up power sources 102 can be minimized, and the arrangement area of the exposure apparatus EX including the back-up power source 102 can be minimized.

As explained above, when the liquid recovery mechanism 20 (second liquid recovery mechanism 60) is driven by the power that is supplied from the commercial power source 100, even when the commercial power source 100 stops supplying power, the power supply for the liquid recovery mechanisms 20, 60 is switched to the back-up power source 102. Accordingly, the liquid 1 that remains on the substrate P is recovered by the liquid recovery mechanisms 20, 60 that are driven by the power that is supplied from the back-up power source 102, and liquid 1 is not left on the substrate P. Therefore, out-flow of the liquid 1 can be suppressed, and occurrence of problems can be suppressed, such as the problems of oxidation or failure of mechanical parts in the vicinity of the substrate stage PST that supports that substrate P, and changes in the environment in which the substrate P is placed. Therefore, after the power supply of the commercial power source 100 recovers, occurrence of problems can be suppressed, such as the problem of deterioration of exposure precision due to the discharged liquid 1, and a device with high pattern precision can be manufactured.

In addition, by providing the liquid absorption member 62 on the substrate stage PST as the second liquid recovery mechanism 60, the liquid 1 can be reliably held (recovered) over a wide range. In addition, by connecting the vacuum system 70 to the liquid absorption member 62 via the flow path 63 and the tube path 68, the liquid 1 absorbed to the liquid absorption member 62 is constantly discharged to the outside of the substrate stage PST. Therefore, changes in the environment (atmosphere) in which the substrate P is placed can be further reliably controlled, and weight fluctuation of the substrate stage PST caused by the liquid 1 can be controlled. On the other hand, the liquid 1 recovered by the liquid absorption member 62 can be made to flow into the liquid recovery portion 73 due to gravity, without providing the vacuum system 70. In addition, it is acceptable to not have the vacuum system 70, the liquid recovery portion 73, etc., and to simply arrange the liquid absorption member 62 on the substrate stage PST, and the liquid absorption member 62 that has absorbed the liquid 1 can be regularly replaced (for example, for each lot). In this case, the weight of the substrate stage PST changes according to the amount of absorbed liquid 1, but stage positioning accuracy can be maintained by changing the stage control parameters according to the weight of the liquid 1 recovered by the liquid absorption member 62.

In addition, instead of the third liquid recovery mechanism 17, a pressure pump may be provided, and connected to the liquid supply flow path of the supply tube 15 via the suction tube 18 (gas exhaust tube in this case), and gas (air) can be discharged toward the supply nozzle 14 from the position immediately after the downstream side of the valve 13. By doing this, after the commercial power source 100 stops supplying power, the liquid 1 stored in the liquid flow path in the supply tube 15 on the downstream side of the valve 13 and in the supply nozzle 14 is discharged onto the substrate P. The discharged liquid can be recovered by the liquid recovery mechanism 20 and/or the second liquid recovery mechanism 60. Furthermore, in this case as well, the pressure pump can be driven based on the information stored in the memory device MRY.

Additionally, it is acceptable to have another vacuum system different from the vacuum system 25 that is normally used, and to connect the back-up power source 102 to this other vacuum system. In this case, if the suction force of the other vacuum system is set to be larger than the suction force of the vacuum system 25, the liquid 1 can be recovered in a short period of time.

Figure 6:
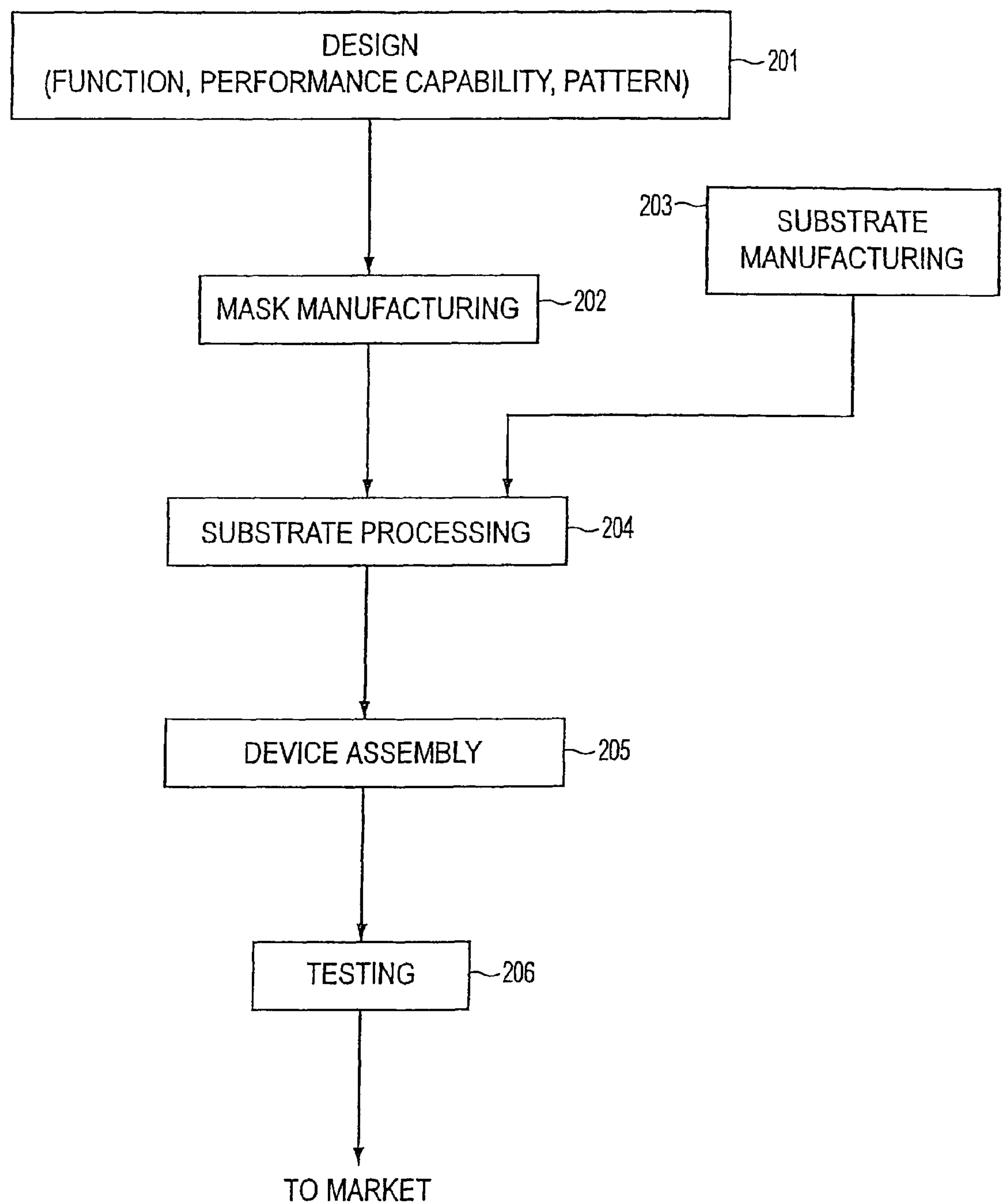
FIG. 6 is a schematic structural view showing another embodiment of an exposure apparatus.

The following explains another embodiment with reference to FIG. 6. The same structural parts as described above are identified by the same symbols, and the description thereof is simplified or omitted.

In FIG. 6, the exposure apparatus EX is provided with the liquid supply mechanism 10 having the supply tube 15 that supply the liquid 1 between the projection optical system PL and the substrate P and the liquid recovery mechanism 20 having the recovery tube 24 that recovers the liquid on the substrate P. Furthermore, the liquid supply mechanism 10 is provided with the third liquid recovery mechanism 17 constituting a suction portion having the suction tube 18 that can draw the liquid 1.

The third liquid recovery mechanism 17 is provided with the same functions as the liquid recovery mechanism 20 and the second liquid recovery mechanism 60, and is provided with a vacuum system 90 connected to one end portion of the suction tube 18, a gas-liquid separator 92 arranged in the suction tube 18, and a dryer 91 that dries the gas separated by the gas-liquid separator 92. Furthermore, the liquid 1 separated by the gas-liquid separator 92 is recovered by a liquid recovery portion 94 via a recovery tube 93.

The liquid supply mechanism 10 is provided with a switching portion 19 that switches the supply path of the supply tube 15 connected to the liquid supply portion 11 with the suction path of the suction tube 18 connected to the vacuum system 90. In this embodiment, the switching portion 19 includes a solenoid valve, and the supply tube 15 and the suction tube 18 are connected to the switching portion 19, respectively.

In this embodiment, a tube member that forms a flow path connecting the vacuum system 90 and the switching portion 19 is called a "suction tube 18", and a tube member that forms a flow path connecting the liquid supply portion 11 and the switching portion 19 is called a "supply tube 15". Furthermore, a tube member that forms a flow path connecting the switching portion 19 and the liquid supply port 14A is called a "supply nozzle 14".

When the operation of the switching portion 19 is controlled by the controller CONT and the switching portion 19 is connected to the supply tube 15, the supply port 14A of the supply nozzle 14 and the liquid supply portion 11 are connected via the supply tube 15. At this point, the suction path of the suction tube 18 is cut off. Meanwhile, when the switching portion 19 is connected to the suction tube 18, the supply port 14A of the supply nozzle 14 and the vacuum system 90 of the third liquid recovery mechanism 17 are connected via the suction tube 18. At this time, the supply path of the supply tube 15 is cut off. Furthermore, there is a possibility that the switching portion 19 becomes a heat source, so in order to suppress the deterioration of exposure precision due to heat, it is preferable that the switching portion 19 is arranged outside of the chamber that stores the exposure apparatus EX.

Furthermore, the switching portion 19 of this embodiment is a so-called normally closed type that mechanically cuts off the supply path of the supply tube 15 by using a spring or the like when an abnormality occurs, for example, when the drive source (commercial power source 100) of the exposure apparatus EX (controller CONT) stops due to a power outage. Additionally, in the switching portion 19 of this embodiment, when an abnormality occurs, the supply path of the supply tube 15 is mechanically closed, and the suction path of the suction tube 18 is opened by connecting the suction path of the suction tube 18.

A check valve 95 is arranged in the suction tube 18. In the suction tube 18 connected to the switching portion 19 and the vacuum system 90, the check valve 95 is arranged between the switching portion 19 and the gas-liquid separator 92 and is arranged in a position close to the switching portion 19. In the liquid 1 flowing into the suction tube 18, the check valve 95 suppresses the liquid 1 from flowing from the vacuum system 90 side to the switching portion 19 side.

The following explains an operation of the exposure apparatus EX having the above-mentioned structure with reference to the schematic view shown in FIG. 7.

Figure 7A:
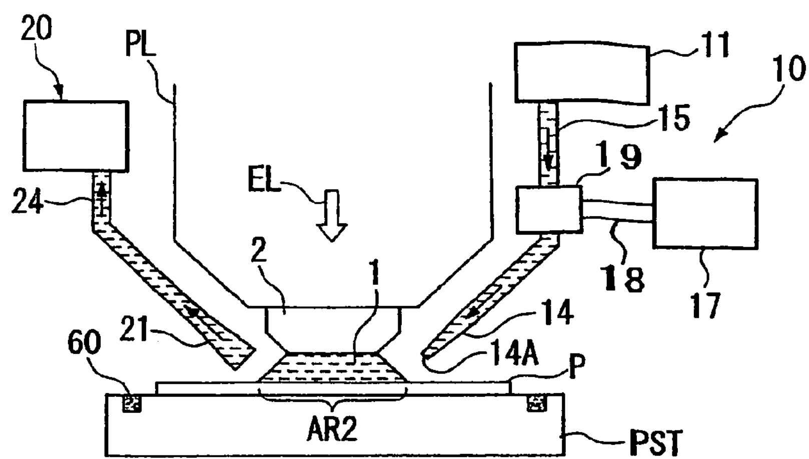
FIGS. 7A, 7B, and 7C are schematic views showing an example of an exposure operation.

When the substrate P supported by the substrate stage PST is liquid-immersion exposed, as shown in FIG. 7A, the controller CONT connects the switching portion 19 to the supply tube 15 of the liquid supply mechanism 10, and connects the liquid supply portion 11 and the supply port 14A of the supply nozzle 14 via the supply tube 15. By doing this, the liquid 1 sent from the liquid supply portion 11 is supplied onto the substrate P via the supply tube 15, the switching portion 19, and the supply port 14A of the supply nozzle 14, and the liquid immersion region AR2 is formed on the substrate P.

Figure 7B:
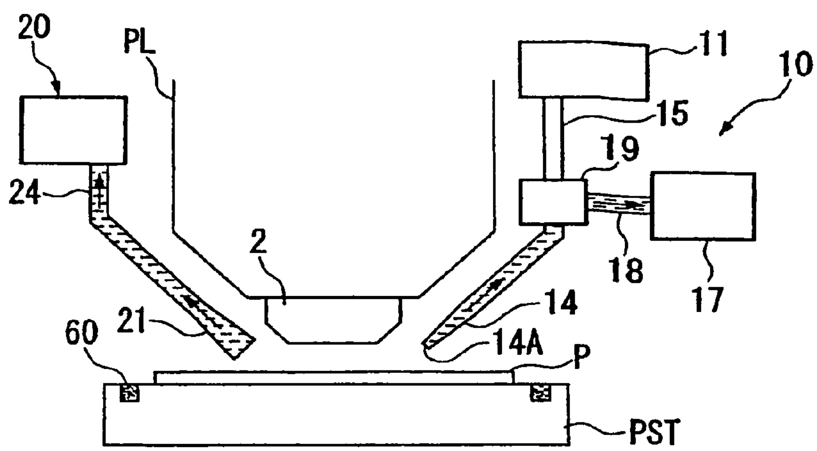

After the liquid immersion exposure of the substrate P is completed, in order to recover the liquid 1 on the substrate P, the controller CONT stops sending (supplying) the liquid 1 from the liquid supply portion 11 of the liquid supply mechanism 10, and the drive of the liquid recovery mechanism 20 and the second liquid recovery mechanism 60 is continued for a predetermined period of time. Furthermore, the controller CONT is connected to the suction tube 18 by driving the switching portion 19, and closes the supply path of the supply tube 15 and opens the suction path of the suction tube 18. By doing this, as shown in FIG. 7B, the liquid 1 on the substrate P is recovered by the third recovery mechanism 17. By doing this, while the liquid 1 is recovered after the exposure is completed, the liquid recovery mechanism 20, the second liquid recovery mechanism 60, and the third liquid recovery mechanism 17 are used, and the liquid recovery operation is performed. Thus, the recovery operation of the liquid 1 can be effectively performed in a short period of time.

After the drive of the liquid recovery mechanism 20, the second liquid recovery mechanism 60, and the third liquid recovery mechanism 17 is continued for a predetermined period of time, and the liquid 1 on the substrate P is recovered, the controller CONT stops the drive of the liquid recovery mechanism 20 and the second liquid recovery mechanism 60. Meanwhile, even after the drive of the liquid recovery mechanism 20 and the second liquid recovery mechanism 60 is stopped, connection of the switching portion 19 to the suction path of the suction tube 18 is continued, and the suction operation by the third liquid recovery mechanism 17 is continued.

Figure 7C:
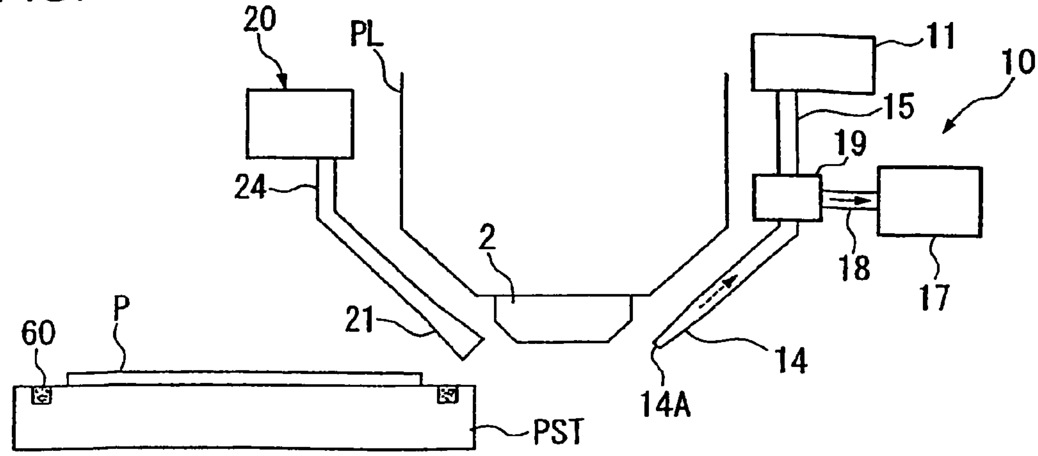

The controller CONT moves the substrate stage PST to an unloaded position in order to unload the substrate P from the substrate stage PST as shown in FIG. 7C. At this time, the switching portion 19 is connected to the suction path of the suction tube 18, and the supply port 14A of the supply nozzle 14 and the vacuum system 90 are connected via the suction tube 18. Therefore, when liquid does not need to be supplied, such as when the liquid supply mechanism 10 does not supply the liquid 1 after (or before) liquid immersion exposure is completed, the suction operation by the third liquid recovery mechanism 17 arranged in the liquid supply mechanism 10 is continued. Thus, the liquid 1 that still remains within the flow path of the supply nozzle 14 and in the vicinity of the supply port 14A is recovered by the third liquid recovery mechanism 17. Because of this, when liquid does not need to be supplied, for example, the liquid supply mechanism 10 does not supply the liquid 1 after (or before) liquid immersion exposure is completed, a problem is suppressed in which the liquid 1 that remains in the supply nozzle 14 leaks (drips) onto the substrate P or the substrate stage PST, or mechanical parts in the vicinity of the substrate stage PST. Therefore, occurrence of a problem can be suppressed in which the leaked liquid causes oxidation or failure of mechanical parts in the vicinity of the substrate stage.

Furthermore, the drive of the liquid recovery mechanism 20 and of the second liquid recovery mechanism 60 is stopped after being continued for a predetermined period of time, but the drive can be further continued. By doing this, even if the liquid 1 drips from the supply nozzle 14, etc., the liquid 1 can be recovered by the liquid recovery mechanism 20 and the second liquid recovery mechanism 60.

Furthermore, during the liquid immersion exposure of the substrate P, when an abnormality occurs, for example, when the commercial power source 100 stops supplying power, the normally closed type switching portion 19 of the liquid supply mechanism 10 is operated, and the supply path of the supply tube 15 is cut off. By doing this, a problem does not occur in which the liquid 1 leaks onto the substrate P from the liquid supply mechanism 10 after the commercial power source 100 stops supplying power. Additionally, when the commercial power source 100 stops supplying power, the switching portion 19 is operated and connected to the suction path of the suction tube 18. The suction path of the suction tube 18 is opened, and the supply port 14A of the supply nozzle 14 and the vacuum system 90 are connected via the suction tube 18. Furthermore, when the commercial power source 100 stops supplying power, the back-up power source 102 supplies the power to the third liquid recovery mechanism 17. When the vacuum system 90 of the third liquid recovery mechanism 17 is operated by the power that is supplied from the back-up power source 102, the liquid 1 that remains within the supply nozzle 14 and in the vicinity of the supply port 14A is drawn by the vacuum system 90 of the third liquid recovery mechanism 17 via the suction tube 18. By doing this, after the commercial power source 100 stops supplying power, a problem can be further reliably suppressed in which the liquid 1 leaks from the liquid supply mechanism 10 to the substrate P, and occurrence of a problem can be suppressed in which the liquid 1 splashes on the substrate stage PST and in the vicinity of the substrate stage PST.

As explained above, when the liquid supply mechanism 10 does not supply the liquid 1, the liquid 1 is drawn by driving the third liquid recovery mechanism 17, and the liquid 1 that remains in the supply nozzle 14 of the liquid supply mechanism 10, etc. can be recovered; thus, a problem can be suppressed, for example, in which the liquid 1 leaks from the liquid supply mechanism 10 when liquid does not need to be supplied. Therefore, occurrence of problems such as oxidation or failure of mechanical parts in the vicinity of the substrate stage PST due to the leaked liquid 1 can be suppressed.

When an abnormality such as a power outage occurs, exposure is impossible, and liquid does not need to be supplied. However, in this case as well, as the liquid 1 is recovered by the third liquid recovery mechanism 17, problems such as the liquid 1 leaking from the liquid supply mechanism 10 after the power supply is stopped can be suppressed.

Additionally, in the suction tube 18, by having the check valve 95 that suppresses the liquid 1 from flowing into the switching portion 19 from the vacuum system 90 side, even when the vacuum system 90 cannot be operated for some reason, a problem can be suppressed in which the drawn liquid 1 flows back onto the substrate P. In this case, by having the check valve 95 in a position close to the switching portion 19 and minimizing the volume of the suction path of the suction tube 18 between the check valve 95 and the switching portion 19, even if the liquid 1 flows back onto the substrate P, the volume of the liquid 1 can be minimized.

In addition, in this embodiment, after liquid immersion exposure is completed or when the commercial power source 100 stops supplying power, the switching portion 19 is operated. However, during the liquid immersion exposure of the substrate P, if the liquid recovery mechanism 20 cannot be operated for some reason and the liquid 1 on the substrate P is not recovered, by operating the switching portion 19, the liquid 1 can be recovered by the third liquid recovery mechanism 17 of the liquid supply mechanism 10. At this point, if the flow amount sensor that can detect the liquid recovery amount by the liquid recovery mechanism 20 is arranged, for example, in recovery tube 24, based on the detection result of the flow amount sensor, the operation status of the liquid recovery mechanism 20 can be determined. Based on the detection result of the flow amount sensor, when the controller CONT determines that the liquid recovery amount is less than or equal to a predetermined value, the liquid supply operation by the liquid supply portion 11 of the liquid supply mechanism 10 is stopped, and the liquid 1 is recovered by the third liquid recovery mechanism 17 by operating the switching portion 19. Thus, even when an abnormality occurs in the liquid recovery operation of the liquid recovery mechanism 20, by operating the switching portion 19, the liquid 1 is recovered by the third liquid recovery mechanism 17 of the liquid supply mechanism 10. Thus, splashing and leaking of the liquid 1 to the outside of the substrate P can be suppressed, and occurrence of a problem can be suppressed, for example, the problem of oxidation of mechanical parts and electric leakage of electronic devices (a drive device such as a linear motor that drives the substrate stage PST and a sensor such as a photo-multiplier).

When an abnormality of the positional relationship between the substrate stage PST that supports the substrate P and the projection optical system PL is detected, the liquid supply by the liquid supply mechanism 10 is stopped, and the suction operation of the liquid 1 by the third liquid recovery mechanism 17 can be started. Here, the abnormal positional relationship between the substrate stage PST and the projection optical system PL is a state in which the liquid 1 cannot be held under the projection optical system PL, and includes an abnormal positional relationship in at least one of the Z axis direction and the XY direction.

That is, even if the operation of the liquid supply mechanism 10 and the liquid recovery mechanism 20 is normal, if an abnormality occurs in the operation of the substrate stage PST, and the substrate stage PST is arranged in a position shifted in the XY direction (or Z direction) relative to a desired position with respect to the projection optical system PL, the liquid immersion region AR2 of the liquid 1 cannot be suitably formed between the projection optical system PL and the substrate P supported by the substrate stage PST (the liquid 1 cannot be held under the projection optical system PL). In this case, the liquid 1 may leak to the outside of the substrate P and/or outside of the substrate stage PST, resulting in the liquid 1 getting on the moving mirrors 45 of the substrate stage PST. Then, the liquid recovery mechanism 20 cannot recover a predetermined amount of liquid 1, so the controller CONT detects that an abnormality occurs based on the detection result of the flow amount sensor arranged in the recovery tube 24, etc. When the abnormality is detected, the controller CONT operates the switching portion 19 and stops the liquid supply operation by the liquid supply mechanism 10, and the liquid 1 is recovered by using the third liquid recovery mechanism 17 of the liquid supply mechanism 10.

Furthermore, in order to detect an abnormality of the positional relationship of the substrate stage PST with respect to the projection optical system PL, without using the detection result of the flow amount sensor arranged in the recovery tube 24, etc. of the liquid recovery mechanism 20, the position of the substrate stage PST in the XY direction is detected by, for example, the interferometers 46, and based on the position detection result, the abnormality of the positional relationship can be detected. The controller CONT compares the substrate stage position detection result obtained by the interferometers 46 with the allowable value that has been set in advance, and when the stage position detection result of the interferometers 46 exceeds the allowable value, the supply operation of the liquid 1 can be stopped, and the operation of the switching portion 19 can be performed. Furthermore, the position of the substrate P in the Z axis direction is detected by a focus detection system that detects the position of the substrate P surface in the Z axis direction, and the stage position detection result by the focus detection system is compared with a preset allowable value. When the detection result of the focus detection system exceeds the allowable value, the controller CONT can stop the supply operation of the liquid 1 and perform the operation of the switching portion 19. Thus, the controller CONT detects the abnormality of the positional relationship between the projection optical system PL and the substrate stage PST, based on the detection result of the substrate stage position detection device including the interferometers 46 and the focus detection system, and when an abnormality is detected, the liquid supply operation can be stopped, the switching portion 19 can be operated, and the liquid 1 can be recovered by the third liquid recovery mechanism 17.

In this embodiment, an explanation was given in which the switching portion 19 switches between the supply tube 15 and the suction tube 18, but a mode (stand-by mode) also can be used in which the switching portion is not connected to either the supply tube 15 or the suction tube 18. Here, the stand-by mode of the liquid supply mechanism 10 includes a mode that does not perform either the supply or recovery of the liquid 1.

Figure 8A:
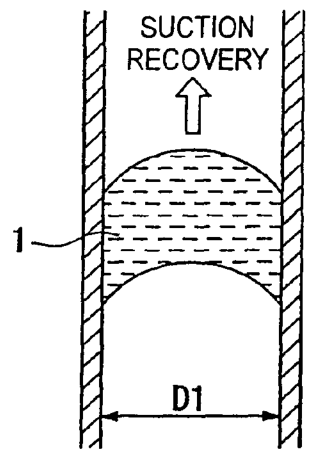
FIGS. 8A and 8B are schematic views showing movement of liquid of a supply path.
Figure 8B:
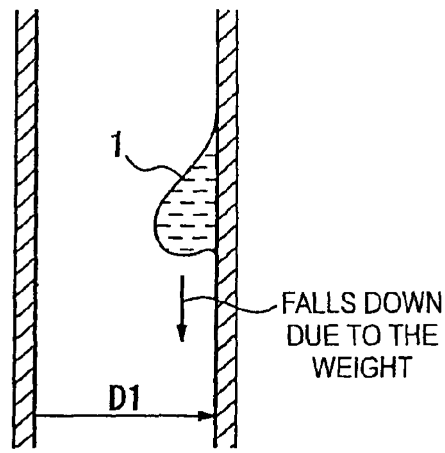

Meanwhile, the cross-sectional area of the supply path between the supply port 14A and the switching portion 19 is determined based on the surface tension of the liquid 1 (water in this embodiment). By optimizing the cross-sectional area of the supply path, based on the surface tension of the liquid 1, when the liquid supply mechanism 10 does not supply the liquid 1, a problem can be further suppressed in which the liquid 1 leaks (drips) from the supply port 14A. Specifically, when the liquid 1 remains in the supply path between the supply port 14A and the switching portion 19, the cross-sectional area of the supply path is determined to be such that the supply path is covered by the surface tension of the liquid 1. That is, when the liquid 1 is stored within a supply path that is set to a cross-sectional area (inner diameter) D1, as shown in the schematic view of FIG. 8A, when the liquid 1 closes the supply path by surface tension of the liquid 1, the pressure difference, with respect to the liquid 1, between the switching portion 19 side (vacuum system 90 side) of the supply path and the supply port 14A side becomes large. Therefore, the liquid 1 is suitably recovered. However, when the surface tension of the liquid 1 (droplet) deteriorates, there is a possibility that a situation might occur in which the supply path cannot be closed, as shown in FIG. 8B. In this case, a problem occurs in which the liquid (droplet) 1 drips due to the weight (gravity effect) of the liquid 1, cannot be recovered by the third liquid recovery mechanism 17, and leaks from the supply port 14A. Then, in order to recover the liquid (droplet) 1, the suction force (drive amount) of the third liquid recovery mechanism 17 needs to be increased, and there will be an energy loss.

Figure 9A:
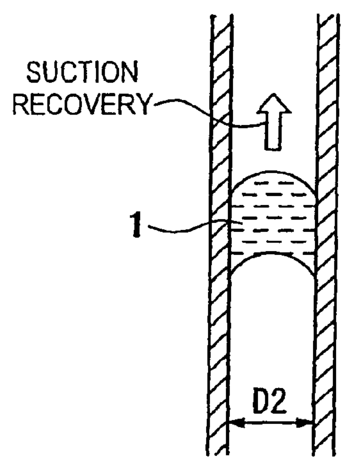
FIGS. 9A and 9B are schematic views showing movement of liquid of a supply path.
Figure 9B:
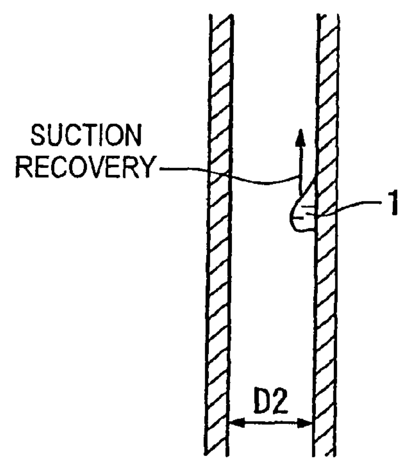

Therefore, in order to suitably recover the liquid 1 by the third liquid recovery mechanism 17, based on the surface tension of the liquid 1, the cross-sectional area of the supply path is made small. FIG. 9A is a schematic view showing a state in which liquid 1 is stored in the supply path having a cross-sectional area (inner diameter) D2 smaller than the cross-sectional area (inner diameter) D1. Even in the case of the liquid 1 whose surface tension is low, by determining the cross-sectional area of the supply path based on the surface tension of the liquid 1, as shown in FIG. 9A, the supply path can be closed by the liquid 1, whereby the liquid 1 can be suitably recovered. Furthermore, as shown in the schematic view of FIG. 9B, in the supply path having a smaller cross-sectional area D2, even if liquid (droplet) 1 still remains, the droplet of the liquid 1 is sufficiently small, so there is no leakage from the supply port 14A caused by drips due to the weight of the liquid (gravity effect), and the droplet of the liquid 1 can be suitably recovered without increasing the suction force (drive force) of the third liquid recovery mechanism 17.

Furthermore, an earthquake can be considered as an abnormality in addition to the above situations. In this case, a vibration detector, such as an acceleration sensor, is provided in the main body of the exposure apparatus or in a location where the main body of the exposure apparatus is arranged. Based on the output of this acceleration sensor, the exposure operation including the liquid supply operation is stopped, and as described in the above embodiment, the liquid recovery operation by the liquid recovery mechanism and the temperature/humidity control by a chamber can be continued.

Furthermore, a P wave detector also can be used as a vibration detector, which detects a P wave, which is transmitted most quickly among earthquake waves and felt as an initial vibration by human beings.

As described above, the liquid 1 of this embodiment is composed of distilled water. There are advantages that a large amount of distilled water can be easily obtained at semiconductor manufacturing facilities and there are no negative effects on the photoresist on the substrate P, the optical elements (lens), etc. In addition, distilled water has no negative effects on the environment, and the amount of contained impurities is extremely low, so the operation also is expected in which the surface of the substrate P and the surface of the optical elements provided on the front end surface of the projection optical system PL are cleansed.

Furthermore, the index of refraction of distilled water (water) with respect to the exposure light EL having a wavelength of approximately 193 nm is about 1.44. Therefore, when the ArF excimer laser (wavelength: 193 nm) is used as a light source of the exposure light EL, the wavelength at the substrate P is shortened to 1/n, that is, to approximately 139 nm, and high resolution is obtained. In addition, the depth of focus is increased by approximately n times compared to that of air, that is, approximately 1.44 times. Thus, when it is sufficient to secure a depth of focus that is approximately the same as when used in air, the numerical aperture of the projection optical system PL can be increased, and the resolution increases because of this point as well.

Additionally, in this embodiment, a lens 2 is mounted on the front end of the projection optical system PL. The optical element mounted on the front end of the projection optical system PL can be an optical plate used for adjusting the optical characteristics of the projection optical system PL, such as aberration (spherical aberration, coma etc.). Instead, it may be a plane parallel plate that can transmit the exposure light EL. Furthermore, when the pressure between the substrate P and the optical element on the front end of the projection optical system generated by the flow of the liquid 1 is large, instead of making the optical element replaceable, the optical element may be rigidly fixed so that it does not move due to the pressure.

In addition, the liquid 1 of this embodiment is water, but liquids other than water may be used. For example, if the light source of the exposure light EL is an $F_2$ laser, the $F_2$ laser light is not transmitted in water. Thus, a liquid of a fluorine system, such as fluorine oil or perfluorinated polyether (PFPE), that can transmit the $F_2$ laser light, may be used as the liquid 1. Furthermore, as the liquid 1, a material also can be used that has transmissivity with respect to the exposure light EL, has high index of refraction, and is stable with respect to the projection optical system PL and the photoresist coated on the substrate P surface (for example, cedar oil).

In the above-described embodiment, an exposure apparatus is used in which liquid is locally filled between the projection optical system PL and the substrate P. However, this invention also can be used in a liquid immersion exposure apparatus in which a stage that holds a substrate to be exposed is moved in a liquid tank, as disclosed in Japanese Laid-Open Patent Application 6-124873, or a liquid immersion exposure apparatus in which a liquid tank having a predetermined depth is formed on a stage and the substrate is held therein, as disclosed in Japanese Laid-Open Patent Application 10-303114.

In addition, not only a semiconductor wafer for manufacturing a semiconductor device, but also a glass substrate for a display device, a ceramic wafer for a thin film magnetic head, and an original plate (synthetic quartz, silicon wafer) of a mask or reticle used in an exposure device can be the substrate P in each of the above-described embodiments.

As the exposure apparatus EX, in addition to the scanning type exposure apparatus (scanning stepper) using a step-and-scan method that scans and exposes a pattern on the mask M by synchronously moving the mask M and the substrate P, a projection exposure apparatus (stepper) using a step-and-repeat method in which the pattern on the mask M is batch-exposed in a state where the mask M and the substrate P remain stationary, and the substrate P is sequentially step-moved, also can be used. Furthermore, this invention also can be used for an exposure apparatus using a step-and-stitch method in which at least two patterns are partially superimposingly transferred onto the substrate P.

As for the type of the exposure apparatus EX, this invention is not limited to the exposure apparatus for manufacturing a semiconductor element that exposes a semiconductor element pattern onto the substrate P. This invention also can be used for an exposure apparatus for manufacturing a liquid crystal display element for manufacturing a display, and an exposure apparatus for manufacturing a thin film magnetic head, an image pick-up element (CCD), or a reticle or mask, for example.

Furthermore, this invention also can be applied to an exposure apparatus that projects spot light by a projection optical system and forms a pattern onto the substrate P without using the mask M.

Additionally, this invention also can be used for a twin stage type exposure apparatus as disclosed in Japanese Laid-Open Patent Application Nos. 10-163099 and 10-214783, Published Japanese translation of PCT International Publication for Patent Application No. 2000-505958, etc.

When a linear motor is used for the substrate stage PST and/or the mask stage MST (see U.S. Pat. No. 5,623,853 and U.S. Pat. No. 5,528,118), an air floating type that uses an air bearing or a magnetic floating type that uses Lorentz forces or reaction forces can be used. In addition, each of the stages PST and MST may be of a type that moves along a guide, or each may be of a guideless type that has no guides.

For the drive mechanism for each of the stages PST and MST, a flat motor may be used that drives each of the stages PST and MST using an electromagnetic force by facing a magnetic unit, in which magnets are two-dimensionally arranged, and an armature unit in which a coil is two-dimensionally arranged. In this case, either the magnetic unit or the armature unit may be connected to the stages PST and MST, and the other of the magnetic unit or the armature unit may be provided on the side of the surface on which the stages PST and MST move.

As described in Japanese Laid-Open Patent Application 8-166475 (U.S. Pat. No. 5,528,118), the reaction force generated by the movement of the substrate stage PST may be mechanically released to the floor (ground), so as not to be transmitted to the projection optical system PL, by using a frame member. As described in Japanese Laid-Open Application 8-330224 (U.S. patent application Ser. No. 08/416,558), the reaction force generated by the movement of the mask stage MST may be mechanically released to the floor (ground), so as not to be transmitted to the projection optical system PL, by using a frame member.

Instead of fixing the moving mirrors 45 to the substrate stage, for example, a reflective surface can be formed on the end surface (side surface) of the Z stage (substrate holder) 51 by mirror finished surface processing. Furthermore, the auxiliary plate 43 was a convex portion, but when the substrate holder is embedded in the Z stage 51, the auxiliary plate 43 can be a concave portion. In addition, the substrate holder can be separate from the Z stage 51. Furthermore, the substrate holder can be a pin chuck type.

Furthermore, by arranging a normally closed valve in the recovery tube of the liquid recovery mechanism 20, power from a back-up power source only needs to be supplied to at least the vacuum system 70 of the vacuum systems 70 and 74 when the main power supply is stopped.

The exposure apparatus of this embodiment is manufactured by assembling the various subsystems including each structural element in such a way as to ensure specific mechanical precision, electrical precision, and optical precision. In order to ensure these types of precision, after and before the exposure apparatus is assembled, adjustments are made to the various optical systems in order to achieve optical precision, adjustments are made to the various mechanical systems in order to achieve mechanical precision, and adjustments are made to the various electrical systems in order to achieve electrical precision. The processes for assembling the various subsystems into the exposure apparatus include, for example, making mechanical connections, connecting cables for electric circuits, connecting ducts for pressure circuits, and the like, between the various subsystems. Each of these various subsystems, of course, has its own individual assembly process before the various subsystems are assembled into the exposure apparatus. Once the process by which the various subsystems are assembled into the exposure apparatus has been completed, overall adjustments are made in order to secure the various types of precision in the exposure apparatus as a whole. Furthermore, it is preferable that the exposure apparatus should be manufactured in a clean room in which the temperature, cleanliness, etc. are controlled.

Figure 10:
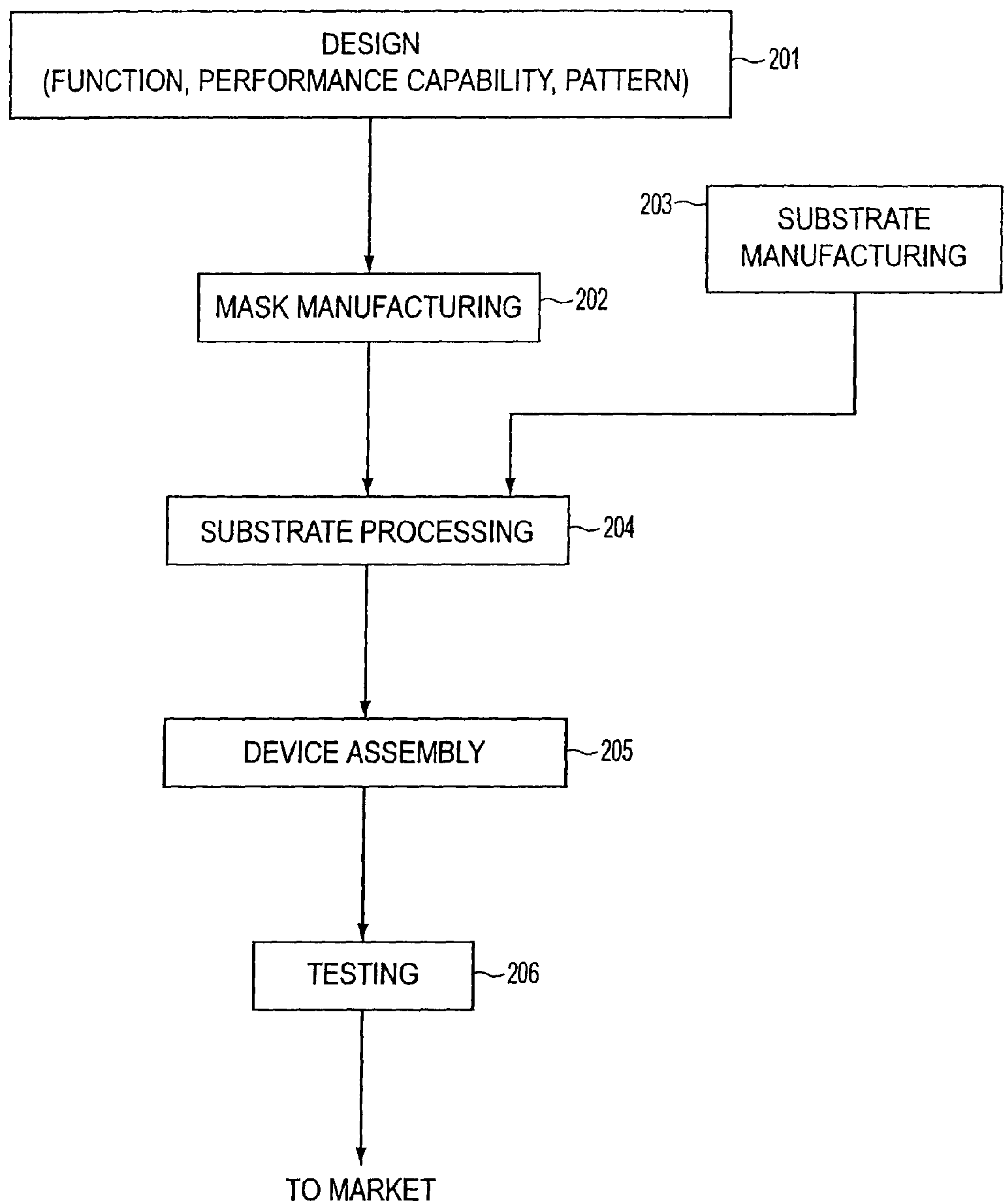
FIG. 10 is a flowchart showing an example of a process of manufacturing a semiconductor device.

As shown in FIG. 10, a micro device, such as a semiconductor device, is manufactured via step 201 of designing a performance capability and a function of the micro device, step 202 of manufacturing a mask (reticle) based on the designing step, step 203 of manufacturing a substrate that is a base material of the device, substrate processing step 204 of exposing a pattern of the mask onto the substrate by using the exposure apparatus EX of the above-described embodiment, device assembly step (including a dicing process, a bonding process, and a packaging process) 205, testing step 206, etc.

Some aspects of this invention relate to an exposure apparatus that exposes an image of a pattern onto a substrate by a projection optical system, and that includes a liquid recovery mechanism that recovers liquid supplied to the substrate by using power that is supplied from a first power source, and a second power source that supplies the power to the liquid recovery mechanism at least when the first power source is abnormal.

Even when the power source is abnormal, for example, when the power supply is stopped, flowing of liquid can be suppressed. Thus, occurrence of a problem due to the discharged liquid can be suppressed. Furthermore, a problem also can be solved in which the liquid is leaked from the liquid supply mechanism when liquid does not need to be supplied. Therefore, a device with good pattern precision can be manufactured, in which a pattern can be transferred onto a substrate with good precision.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An exposure apparatus which exposes a substrate by projecting an image of a pattern onto the substrate via a projection optical system and a liquid, the exposure apparatus comprising:

a liquid supply system including (i) a liquid supply flow path having a liquid supply inlet located above the substrate at least during the exposure of the substrate via the projection optical system, and (ii) a discharging device configured to discharge liquid remaining in the liquid supply flow path; and a controller configured to control the discharging device to discharge the liquid remaining in the liquid supply flow path from the liquid supply flow path after the supply of the liquid via the liquid supply flow path is stopped, wherein the liquid supply system supplies the liquid via the liquid supply inlet to form a liquid immersion region with the supplied liquid in a space between the projection optical system and a part of the substrate at least during the exposure.

2. A method of manufacturing a device using the exposure apparatus according to claim 1.

3. The exposure apparatus according to claim 1, wherein the controller is configured to control the discharging device to discharge the remaining liquid from the liquid supply flow path after power supply is stopped.

4. The exposure apparatus according to claim 1, wherein the controller causes the liquid supply flow path to communicate with a vacuum source via the discharging device to discharge the remaining liquid in the liquid supply flow path.

5. The exposure apparatus according to claim 1, wherein the controller causes the liquid supply flow path to communicate with a gas source via the discharging device to discharge the remaining liquid in the liquid supply flow path.

6. The exposure apparatus according to claim 1, further comprising:

a liquid recovery system having a recovery path that recovers the liquid supplied from the liquid supply inlet, the recovery path being different from the liquid supply flow path.

7. The exposure apparatus according to claim 6, wherein supply of the liquid through the liquid supply flow path is executed in parallel with recovery of the supplied liquid through the recovery path at least during the exposure.

8. The exposure apparatus according to claim 1, wherein the discharging device includes a flow path communicated to the liquid supply flow path in at least a period in which the exposure of the substrate is not performed.

9. The exposure apparatus according to claim 8, wherein the flow path is connected to the liquid supply flow path via an open-close member.

10. The exposure apparatus according to claim 1, wherein the discharge of the liquid in the liquid supply flow path is executed by supplying power from a back-up power source.

11. The exposure apparatus according to claim 1, further comprising:

a substrate stage which holds the substrate, wherein the liquid immersion region moves on the substrate held by the substrate stage by a movement of the substrate stage.

12. An exposure apparatus which exposes a substrate by projecting an image of a pattern onto the substrate via a projection optical system and a liquid, the exposure apparatus comprising:

a liquid supply system including (i) a liquid supply flow path that supplies the liquid, and (ii) a sensor configured to detect liquid that remains in the liquid supply flow path; and a controller that receives an output of the sensor and is configured to determine whether the sensor detects liquid that remains in the liquid supply flow path after the supply of the liquid via the liquid supply flow path is cut off.

13. A method of manufacturing a device using the exposure apparatus according to claim 12.

14. The exposure apparatus according to claim 12, wherein the detection by the sensor is executed by supplying power from a back-up power source.

15. The exposure apparatus according to claim 12, wherein the liquid supply flow path has a liquid supply inlet located above the substrate at least during the exposure of the substrate via the projection optical system, and wherein a liquid is supplied via the liquid supply inlet to form a liquid immersion region of the liquid in a space between the projection optical system and a part of the substrate at least during the exposure.

16. An exposure apparatus comprising:

a projection optical system via which an image of a pattern is projected onto a substrate to expose the substrate;

a liquid supply system having a supply path that supplies liquid to a space between the projection optical system and the substrate, an end of the supply path having a supply opening from which the liquid is supplied to the space through the supply path during exposure of the substrate;

a liquid recovery system having a recovery path that recovers the liquid from the space during the exposure;

a movable member configured to hold the substrate during projection of the pattern onto the substrate, the movable member being movable below and relative to the supply opening and the recovery path at least during the exposure of the substrate via the projection optical system; and a suction path through which a vacuum is applied to at least part of the supply path of the liquid supply system when the exposure apparatus functions abnormally, an inlet end of the suction path is connected with the at least part of the supply path between the supply opening and a portion of the supply path located upstream of the supply opening.

17. The exposure apparatus according to claim 16, wherein the liquid supply system includes a switching device by which the at least part of the supply path and the suction path are connected.

18. The exposure apparatus according to claim 17, wherein the switching device includes a valve.

19. The exposure apparatus according to claim 16, wherein a check valve is disposed in the suction path.

20. The exposure apparatus according to claim 16, wherein a cross-sectional area of the supply path is determined based on a surface tension of the liquid.

21. A method of manufacturing a device, the method comprising:

exposing a substrate with an image of a pattern projected through liquid and the projection optical system of the exposure apparatus according to claim 16; and processing the exposed substrate.

22. The exposure apparatus according to claim 16, wherein the at least part of the supply path is connected to a vacuum source through the suction path in an event of a failure in supply of power has occurred as an abnormality of the exposure apparatus.

23. The exposure apparatus according to claim 16, wherein the movable member is a substrate table, and an abnormality in the exposure apparatus function includes an abnormal positional relation between the projection optical system and the substrate table.

24. The exposure apparatus according to claim 16, wherein an abnormality in the exposure apparatus function includes a failure of the liquid recovery system.

25. The exposure apparatus according to claim 16, wherein the vacuum is applied to the supply path through the suction path after finishing the exposure of the substrate.

26. The exposure apparatus according to claim 16, wherein the liquid supply system includes a valve by which the liquid supply from the supply opening is stopped, and wherein the inlet end of the suction path is connected with the at least part of the supply path between the supply opening and the valve.

27. The exposure apparatus according to claim 16, wherein supply of the liquid through the supply path is executed in parallel with recovery of the supplied liquid through the recovery path at least during the exposure.

28. The exposure apparatus according to claim 16, wherein suction by the suction path is executed by supplying power from a back-up power source.

29. The exposure apparatus according to claim 16, wherein the supply opening is located above the substrate at least during the exposure of the substrate via the projection optical system, and wherein a liquid is supplied via the supply inlet to form a liquid immersion region of the liquid in a space between the projection optical system and a part of the substrate at least during the exposure.

30. The exposure apparatus according to claim 16, further comprising:

a controller configured to cause the vacuum to be applied to the at least part of the supply path of the liquid supply system when the exposure apparatus functions abnormally.

31. A device manufacturing method comprising:

exposing a substrate by projecting an image of a pattern onto the substrate via a projection optical system and a liquid; and processing the exposed substrate, wherein the liquid is supplied onto the substrate by a liquid supply system including (i) a liquid supply flow path having a liquid supply inlet located above the substrate at least during the exposure of the substrate via the projection optical system, and (ii) a discharging device configured to discharge liquid remaining in the liquid supply flow path, the discharging device is controlled to discharge the liquid remaining in the liquid supply flow path from the liquid supply flow path after the supply of the liquid via the liquid supply flow path is stopped, and the liquid supply system supplies the liquid via the liquid supply inlet to form a liquid immersion region with the supplied liquid in a space between the projection optical system and a part of the substrate at least during the exposure.

32. The method according to claim 31, wherein the discharging device is controlled to discharge the remaining liquid from the liquid supply flow path after power supply is stopped.

33. The method according to claim 31, wherein the liquid supply flow path is communicated with a vacuum source via the discharging device to discharge the remaining liquid in the liquid supply flow path.

34. The method according to claim 31, wherein the liquid supply flow path is communicated with a gas source via the discharging device to discharge the remaining liquid in the liquid supply flow path.

35. The method according to claim 31, wherein the liquid supplied from the liquid supply inlet is recovered from the substrate by a liquid recovery system having a recovery path, the recovery path being different from the liquid supply flow path.

36. The method according to claim 35, wherein supply of the liquid through the liquid supply flow path is executed in parallel with recovery of the supplied liquid through the recovery path at least during the exposure.

37. The method according to claim 31, wherein the discharging device includes a flow path communicated to the liquid supply flow path in at least a period in which the exposure of the substrate is not performed.

38. The method according to claim 37, wherein the flow path is connected to the liquid supply flow path via an open-close member.

39. The method according to claim 31, wherein the discharge of the liquid in the liquid supply flow path is executed by supplying power from a back-up power source.

40. The method according to claim 31, wherein:

the substrate is held by a substrate stage, and the liquid immersion region moves on the substrate held by the substrate stage by a movement of the substrate stage.

41. A device manufacturing method comprising:

exposing a substrate by projecting an image of a pattern onto the substrate via a projection optical system and a liquid; and processing the exposed substrate, wherein the liquid is supplied onto the substrate by a liquid supply system including (i) a liquid supply flow path that supplies the liquid, and (ii) a sensor configured to detect liquid that remains in the liquid supply flow path, and an output of the sensor is used to determine whether the sensor detects liquid that remains in the liquid supply flow path after the supply of the liquid via the liquid supply flow path is cut off.

42. The method according to claim 41, wherein detection by the sensor is executed by supplying power from a back-up power source.

43. The method according to claim 41, wherein the liquid supply flow path has a liquid supply inlet located above the substrate at least during the exposure of the substrate via the projection optical system, and wherein the liquid is supplied via the liquid supply inlet to form a liquid immersion region of the liquid in a space between the projection optical system and a part of the substrate at least during the exposure.

44. A device manufacturing method comprising:

exposing a substrate by projecting an image of a pattern onto the substrate via a projection optical system and a liquid; and processing the exposed substrate, wherein the liquid is supplied onto the substrate by a liquid supply system having a supply path that supplies the liquid to a space between the projection optical system and the substrate, an end of the supply path having a supply opening from which the liquid is supplied to the space through the supply path during exposure of the substrate, the liquid is recovered from the space during the exposure by a liquid recovery system having a recovery path, the substrate is held by a movable member during projection of the pattern onto the substrate, the movable member being movable below and relative to the supply opening and the recovery path at least during the exposure of the substrate via the projection optical system; and a vacuum is applied through a suction path to at least part of the supply path of the liquid supply system when an abnormality occurs, an inlet end of the suction path being connected with the at least part of the supply path between the supply opening and a portion of the supply path located upstream of the supply opening.

45. The method according to claim 44, wherein the liquid supply system includes a switching device by which the at least part of the supply path and the suction path are connected.

46. The method according to claim 45, wherein the switching device includes a valve.

47. The method according to claim 44, wherein a check valve is disposed in the suction path.

48. The method according to claim 44, wherein a cross-sectional area of the supply path is determined based on a surface tension of the liquid.

49. The method according to claim 44, wherein the abnormality includes a failure in supply of power, and suction by the suction path is executed by supplying power from a back-up power source.

50. The method according to claim 44, wherein the movable member is a substrate table, and the abnormality includes an abnormal positional relation between the projection optical system and the substrate table.

51. The method according to claim 44, wherein the abnormality includes a failure of the liquid recovery system.

52. The method according to claim 44, wherein the vacuum is applied to the supply path through the suction path after finishing the exposure of the substrate.

53. The method according to claim 44, wherein the liquid supply system includes a valve by which the liquid supply from the supply opening is stopped, and wherein the inlet end of the suction path is connected with the at least part of the supply path between the supply opening and the valve.

54. The method according to claim 44, wherein supply of the liquid through the supply path is executed in parallel with recovery of the supplied liquid through the recovery path at least during the exposure.

55. The method according to claim 44, wherein suction by the suction path is executed by supplying power from a back-up power source.

56. The method according to claim 44, wherein the supply opening is located above the substrate at least during the exposure of the substrate via the projection optical system, and the liquid is supplied via the supply inlet to form a liquid immersion region of the liquid in a space between the projection optical system and a part of the substrate at least during the exposure.

* * * * *